United States Patent
Park et al.

(10) Patent No.: US 11,740,720 B2
(45) Date of Patent: Aug. 29, 2023

(54) TOUCH DISPLAY DEVICE

(71) Applicant: LG Display Co., Ltd., Seoul (KR)

(72) Inventors: YongChan Park, Seoul (KR); JuHong Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/894,851

(22) Filed: Aug. 24, 2022

(65) Prior Publication Data

US 2023/0094749 A1 Mar. 30, 2023

(30) Foreign Application Priority Data

Sep. 30, 2021 (KR) .................. 10-2021-0129791

(51) Int. Cl.
*G06F 3/041* (2006.01)
*G06F 3/044* (2006.01)

(52) U.S. Cl.
CPC ........ *G06F 3/0412* (2013.01); *G06F 3/04164* (2019.05); *G06F 3/0443* (2019.05); *G06F 2203/04107* (2013.01)

(58) Field of Classification Search
None
See application file for complete search history.

(56) References Cited

U.S. PATENT DOCUMENTS

| | | | | |
|---|---|---|---|---|
| 11,334,179 | B2* | 5/2022 | Li | G06F 3/0412 |
| 2011/0298746 | A1 | 12/2011 | Hotelling | |
| 2018/0348937 | A1* | 12/2018 | Pak | G06F 3/0446 |
| 2019/0056829 | A1 | 2/2019 | Ye | |
| 2019/0187850 | A1* | 6/2019 | Kim | G06F 3/0445 |
| 2019/0302934 | A1* | 10/2019 | Rhe | G06F 3/0446 |

FOREIGN PATENT DOCUMENTS

| | | | |
|---|---|---|---|
| EP | 3316103 A1 | 5/2018 | |
| EP | 3783467 A1 | 2/2021 | |
| EP | 3842903 A1 | 6/2021 | |

* cited by examiner

*Primary Examiner* — Duane N Taylor, Jr.
(74) *Attorney, Agent, or Firm* — Seed IP Law Group LLP

(57) ABSTRACT

A touch display device includes a display cathode electrode, a first touch cathode electrode adjacent to and disposed in the same layer as the display cathode electrode, a first touch line coupled with a touch driving circuit, a first touch bridge coupled with the first touch line, a second touch cathode electrode adjacent to and disposed in the same layer as the display cathode electrode, a second touch line coupled with the touch driving circuit, and a second touch bridge coupled with the second touch line. The first touch cathode electrode is electrically separated from and the second touch cathode electrode is electrically shorted with the display cathode electrode. The first touch bridge is coupled with the first touch cathode electrode. The second touch bridge is separated from the second touch cathode electrode, and the second touch line and the second touch cathode electrode are separated from each other.

19 Claims, 16 Drawing Sheets

TOUCH DISPLAY DEVICE

CROSS-REFERENCE TO RELATED APPLICATION

This application claims priority from Korean Patent Application No. 10-2021-0129791, filed on Sep. 30, 2021, which is hereby incorporated by reference for all purposes as if fully set forth herein.

BACKGROUND

Technical Field

Embodiments of the disclosure relate to a touch display device.

Description of Related Art

Among others, touch display devices provide an input scheme that allows users easier and more intuitive and convenient entry of information or commands without the need for buttons, a keyboard, a mouse, or other typical input means.

A touch display device may include a plurality of subpixels for displaying images and a plurality of touch electrodes for touch sensing. The touch display device may display an image by driving the plurality of subpixels and may sense a touch by driving and sensing the plurality of touch electrodes.

For various reasons, touch display devices in which a plurality of touch electrodes are embedded in the display panel as a touch sensor have recently been developed. Meanwhile, there has been extensive development of self-emission display devices that have self-emission light emitting elements, such as organic light emitting diodes (OLEDs), formed in the display panel, thanks to their various merits, such as rapid response, high light emission efficiency, high luminance, and wide field-of-view, as compared with liquid crystal displays. The touch sensing functions are also incorporated into the self-emission type display devices.

BRIEF SUMMARY

The touch display devices in the related art have various short comings.

The plurality of touch electrodes embedded in the display panel of the touch display devices may be touch sensor-dedicated electrodes. If the plurality of touch electrodes embedded in the display panel are touch sensor-dedicated electrodes, the manufacturing process of the display panel may require a process for forming a plurality of touch electrodes separately from the process of forming electrodes or lines for the display.

If the plurality of touch electrodes embedded in the display panel are touch sensor-dedicated electrodes, the manufacture of the display panel may be complicated as described above, and the display panel may be thickened due to additional formation of the plurality of touch electrodes in the display panel.

If the plurality of touch electrodes embedded in the display panel are common electrodes used for display driving as well, two types of driving (display driving and touch driving) need to be performed on the touch electrodes, so that driving complexity increases, and displaying performance and touch sensing performance may be deteriorated.

If the self-emission display device including an OLED panel is a touch display device, it is not easy to embed a plurality of touch electrodes in the display panel by the nature of the display panel.

That is, one of the short comings of the devices in the related art is that embedding touch sensor-dedicated touch electrodes in the display panel may lead to complicated panel manufacture and an increase in panel thickness. If touch electrodes also available for display driving are embedded in the display panel, driving may be more complicated.

The inventors of the disclosure have provided one or more embodiments that address the various technical problems in the related art including the problems identified above. They have developed a touch display device having touch sensor-dedicated touch electrodes embedded in the display panel without thickening the display panel and complicating the panel manufacturing process.

Meanwhile, when touch electrodes are embedded in the display panel, display driving-related electrodes or lines are positioned adjacent to the touch electrodes, so that display driving may be affected by touch driving, degrading image quality. Thus, despite various techniques developed for reducing influence of image quality by touch driving in the touch and display field, the issue with degradation of image quality due to touch driving still remains.

The inventors of the disclosure have found that degradation of image quality due to touch driving comes from a minute short circuit between the touch electrodes and their surrounding display driving-related electrode through long-term panel analysis and experiments. The inventors have developed a touch display device that is free from degradation of image quality due to touch driving even when a minute short circuit occurs between touch electrodes and their surrounding display driving-related electrode based on the results found through panel analysis and experiments.

According to embodiments of the disclosure, there may be provided a touch display device having touch sensor-dedicated touch electrodes embedded in the display panel without thickening the display panel and complicating the panel manufacturing process.

According to embodiments of the disclosure, there may be provided a touch display device that is free from degradation of image quality due to touch driving even when an undesired minute short circuit occurs between touch electrodes and a display driving-related electrode.

According to embodiments of the disclosure, there may be provided a touch display device in which a cathode electrode layer is composed of a display cathode electrode and touch cathode electrodes, and touch electrodes are configured through the touch cathode electrodes.

According to embodiments of the disclosure, there may be provided a touch display device that is free from degradation of image quality due to touch driving even when an undesired minute short circuit occurs between a display cathode electrode and a touch cathode electrode.

Embodiments of the disclosure may provide a touch display device comprising a display cathode electrode to which a display cathode voltage is applied, a first touch cathode electrode disposed in a same layer as the display cathode electrode and adjacent to the display cathode electrode, a first touch line electrically connected with a touch driving circuit, a first touch bridge electrically connected with the first touch line, a second touch cathode electrode disposed in a same layer as the display cathode electrode and adjacent to the display cathode electrode, a second touch line electrically connected with the touch driving circuit, and a second touch bridge electrically connected with the second touch line.

The first touch cathode electrode may be electrically separated from the display cathode electrode. In this case, the first touch bridge may be electrically connected with the first touch cathode electrode. The first touch line and the first touch cathode electrode may be electrically connected with each other through the first touch bridge.

The second touch cathode electrode may be electrically shorted with the display cathode electrode. In this case, the second touch bridge may be electrically separated from the second touch cathode electrode, and the second touch line and the second touch cathode electrode may be electrically separated from each other.

A shorting material may exist between the second touch cathode electrode and the display cathode electrode. In this case, the second touch cathode electrode and the display cathode electrode may be shorted by the shorting material. The shorting material may include at least one of a foreign material, an organic material, and a cathode electrode material.

Embodiments of the disclosure may provide a touch display device comprising a display panel including a plurality of subpixels and a plurality of touch electrodes, a display driving circuit configured to drive the plurality of subpixels, and a touch driving circuit configured to drive the plurality of touch electrodes.

Each of the plurality of touch electrodes may include a plurality of touch cathode electrodes electrically connected with each other.

The plurality of touch electrodes may include a first touch electrode and a second touch electrode.

The number of a plurality of touch cathode electrodes constituting the first touch electrode and electrically connected with each other may differ from the number of a plurality of touch cathode electrodes constituting the second touch electrode and electrically connected with each other.

According to embodiments of the disclosure, there may be provided a touch display device having touch sensor-dedicated touch electrodes embedded in the display panel without thickening the display panel and complicating the panel manufacturing process.

According to embodiments of the disclosure, there may be provided a touch display device that is free from degradation of image quality due to touch driving even when an undesired minute short circuit occurs between touch electrodes and a display driving-related electrode.

According to embodiments of the disclosure, there may be provided a touch display device in which a cathode electrode layer is composed of a display cathode electrode and touch cathode electrodes, and touch electrodes are configured through the touch cathode electrodes.

According to embodiments of the disclosure, there may be provided a touch display device that is free from degradation of image quality due to touch driving even when an undesired minute short circuit occurs between a display cathode electrode and a touch cathode electrode.

DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
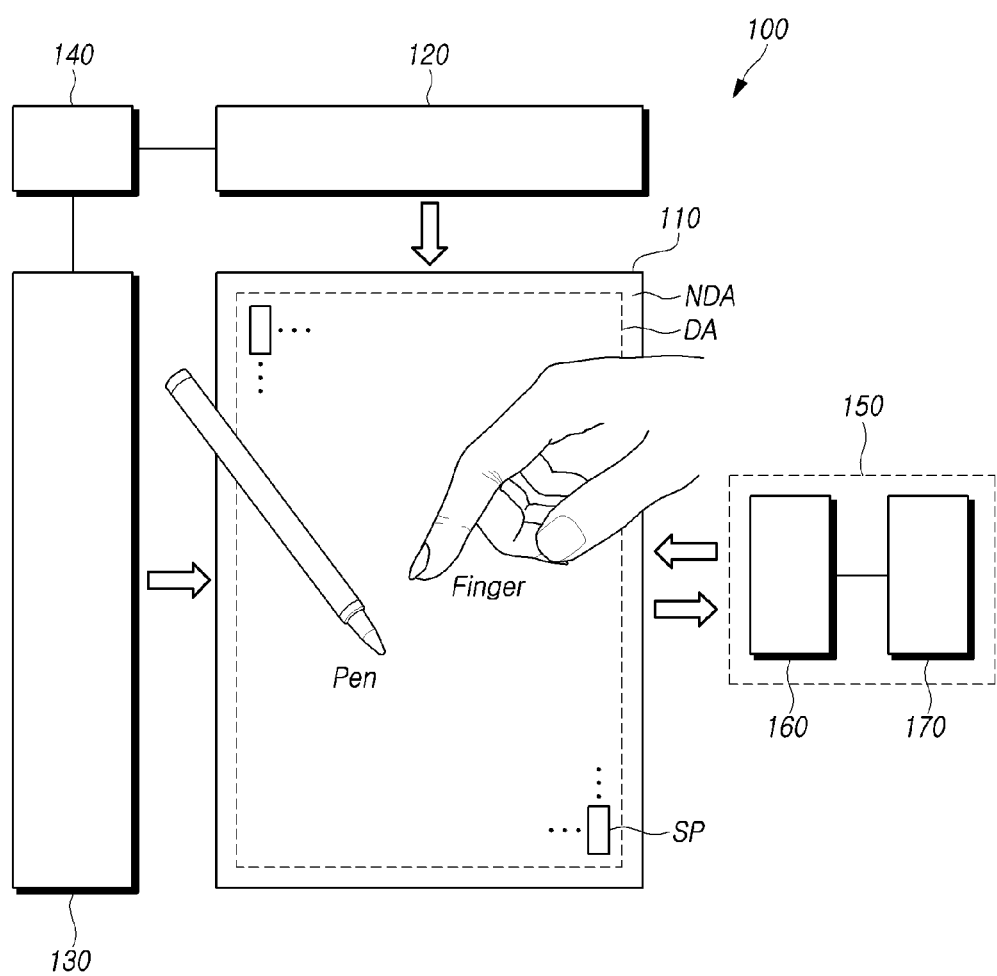
FIG. 1 is a view illustrating a system configuration of a touch display device according to embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", and "constituting" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to", "overlaps", etc., a second element, it should be interpreted that, not only can the first element "be directly connected or coupled to" or "directly contact or overlap" the second element, but a third element can also be "interposed" between the first and second elements, or the first and second elements can "be connected or coupled to", "overlap", etc., each other via a fourth element. Here, the second element may be included in at least one of two or more elements that "are connected or coupled to", "contact or overlap", etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view illustrating a system configuration of a touch display device 100 according to embodiments of the disclosure.

Referring to FIG. 1, a touch display device 100 may include a display panel 110 and display driving circuits, as components for displaying images.

The display driving circuits are circuits for driving the display panel 110 and may include a data driving circuit 120, a gate driving circuit 130, and a display controller 140.

The display panel 110 may include a display area DA in which images are displayed and a non-display area NDA in which no image is displayed. The non-display area NDA may be an outer area of the display area DA and be referred to as a bezel area. The whole or part of the non-display area NDA may be an area visible from the front surface of the touch display device 100 or an area that is bent and not visible from the front surface of the touch display device 100.

The display panel 110 may include a plurality of subpixels SP. The display panel 110 may further include various types of signal lines to drive the plurality of subpixels SP.

The touch display device 100 according to embodiments of the disclosure may be a liquid crystal display device or a self-emission display device in which the display panel 110 emits light by itself. When the touch display device 100 according to the embodiments of the disclosure is a self-emission display device, each of the plurality of subpixels SP may include a light emitting element.

For example, the touch display device 100 according to embodiments of the disclosure may be an organic light emitting diode display device in which the light emitting element is implemented as an organic light emitting diode (OLED). As another example, the touch display device 100 according to embodiments of the disclosure may be an inorganic light emitting display device in which the light emitting element is implemented as an inorganic material-based light emitting diode. As another example, the touch display device 100 according to embodiments of the disclosure may be a quantum dot display device in which the light emitting element is implemented as a quantum dot which is self-emission semiconductor crystal.

The structure of each of the plurality of subpixels SP may vary according to the type of the touch display device 100. For example, when the touch display device 100 is a self-emission display device in which the subpixels SP emit light by themselves, each subpixel SP may include a light emitting element that emits light by itself, one or more transistors, and one or more capacitors.

For example, various types of signal lines may include a plurality of data lines transferring data signals (also referred to as data voltages or image signals) and a plurality of gate lines transferring gate signals (also referred to as scan signals).

The plurality of data lines and the plurality of gate lines may cross each other. Each of the plurality of data lines may be disposed while extending in a first direction. Each of the plurality of gate lines may be disposed while extending in a second direction.

Here, the first direction may be a column direction and the second direction may be a row direction. Alternatively, the first direction may be the row direction, and the second direction may be the column direction.

The data driving circuit 120 is a circuit for driving the plurality of data lines and may supply data signals to the plurality of data lines. The gate driving circuit 130 is a circuit for driving the plurality of gate lines and may supply gate signals to the plurality of gate lines. The display controller 140 is a device for controlling the data driving circuit 120 and the gate driving circuit 130 and may control driving timings for the plurality of data lines and driving timings for the plurality of gate lines.

The display controller 140 may supply a data driving control signal to the data driving circuit 120 to control the data driving circuit 120 and may supply a gate driving control signal to the gate driving circuit 130 to control the gate driving circuit 130.

The data driving circuit 120 may supply data signals to the plurality of data lines according to the driving timing control of the display controller 140. The data driving circuit 120 may receive digital image data from the display controller 140 and may convert the received image data into analog data signals and output the analog data signals to the plurality of data lines.

The gate driving circuit 130 may supply gate signals to the plurality of gate lines GL (see FIG. 2) according to the driving timing control of the display controller 140. The gate driving circuit 130 may receive a first gate voltage corresponding to a turn-on level voltage and a second gate voltage corresponding to a turn-off level voltage, along with various gate driving control signals (e.g., start signal and reset signal), generate gate signals, and supply the generated gate signals to the plurality of gate lines.

For example, the data driving circuit 120 may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate or may be connected to the substrate.

In other words, the gate driving circuit 130 that is of a GIP type may be disposed in the non-display area NDA of the substrate. The gate driving circuit 130 that is of a chip-on-glass (COG) type or chip-on-film (COF) type may be connected to the substrate.

Meanwhile, at least one of the data driving circuit 120 and the gate driving circuit 130 may be disposed in the display area DA of the display panel 110. For example, at least one of the data driving circuit 120 and the gate driving circuit 130 may be disposed not to overlap the subpixels SP or to overlap all or some of the subpixels SP.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The display controller 140 may be implemented as a separate component from the data driving circuit 120, or the display controller 140 and the data driving circuit 120 may be integrated into an integrated circuit (IC).

The display controller 140 may be a timing controller used in typical display technology, a control device that may perform other control functions as well as the functions of the timing controller, or a control device other than the timing controller, or may be a circuit in the control device. The display controller 140 may be implemented as various circuits or electronic components, such as an integrated circuit (IC), a field programmable gate array (FPGA), an application specific integrated circuit (ASIC), or a processor.

The display controller 140 may be mounted on a printed circuit board or a flexible printed circuit and may be electrically connected with the data driving circuit 120 and the gate driving circuit 130 through the printed circuit board or the flexible printed circuit.

The display controller 140 may transmit/receive signals to/from the data driving circuit 120 according to one or more predetermined interfaces. The interface may include, e.g., a low voltage differential signaling (LVDS) interface, an EPI interface, and a serial peripheral interface (SP).

To provide a touch sensing function as well as an image display function, the touch display device 100 according to embodiments of the disclosure may include a touch panel and a touch sensing circuit 150 that senses the touch panel to detect whether a touch occurs by a touch object, such as a finger or pen, or the position of the touch.

The touch sensing circuit 150 may include a touch driving circuit 160 that drives and senses the touch panel and generates and outputs touch sensing data and a touch controller 170 that may detect an occurrence of a touch or the position of the touch using touch sensing data.

The touch panel may include a plurality of touch electrodes as touch sensors. The touch panel may further include a plurality of touch lines for electrically connecting the plurality of touch electrodes and the touch driving circuit 160. The touch panel or touch electrode is also referred to as a touch sensor.

The touch panel may exist outside or inside the display panel 110. When the touch panel exists outside the display panel 110, the touch panel is referred to as an external type. When the touch panel is of the external type, the touch panel and the display panel 110 may be separately manufactured and may be combined during an assembly process. The external-type touch panel may include a substrate and a plurality of touch electrodes on the substrate. When the touch panel exists inside the display panel 110, the touch panel is referred to as an internal type. When the touch panel is of the internal type, the touch panel may be formed in the display panel 110 during a manufacturing process of the display panel 110.

The touch driving circuit 160 may supply a touch driving signal to at least one of the plurality of touch electrodes and may sense at least one of the plurality of touch electrodes to generate touch sensing data.

The touch sensing circuit 150 may perform touch sensing in a self-capacitance sensing scheme or a mutual-capacitance sensing scheme.

When the touch sensing circuit 150 performs touch sensing in the self-capacitance sensing scheme, the touch sensing circuit 150 may perform touch sensing based on capacitance between each touch electrode and the touch object (e.g., finger or pen).

According to the self-capacitance sensing scheme, each of the plurality of touch electrodes may serve both as a driving touch electrode and as a sensing touch electrode. The touch driving circuit 160 may drive all or some of the plurality of touch electrodes and sense all or some of the plurality of touch electrodes.

When the touch sensing circuit 150 performs touch sensing in the mutual-capacitance sensing scheme, the touch sensing circuit 150 may perform touch sensing based on capacitance between the touch electrodes.

According to the mutual-capacitance sensing scheme, the plurality of touch electrodes are divided into driving touch electrodes and sensing touch electrodes. The touch driving circuit 160 may drive the driving touch electrodes and sense the sensing touch electrodes.

As described above, the touch sensing circuit 150 may perform touch sensing in a self-capacitance sensing scheme and/or a mutual-capacitance sensing scheme. However, for convenience of description, it is assumed below that the touch sensing circuit 150 performs touch sensing using a self-capacitance sensing scheme.

The touch driving circuit 160 and the touch controller 170 included in the touch sensing circuit 150 may be implemented as separate devices or as a single device.

The touch driving circuit 160 and the data driving circuit 120 may be implemented as separate devices or as a single device.

The touch display device 100 may further include a power supply circuit for supplying various types of power to the display driver integrated circuit and/or the touch sensing circuit.

The touch display device 100 according to embodiments of the disclosure may be a mobile terminal, such as a smart phone or a tablet, or a monitor or television (TV) in various sizes but, without limited thereto, may be a display in various types and various sizes capable of displaying information or images.

Figure 2:
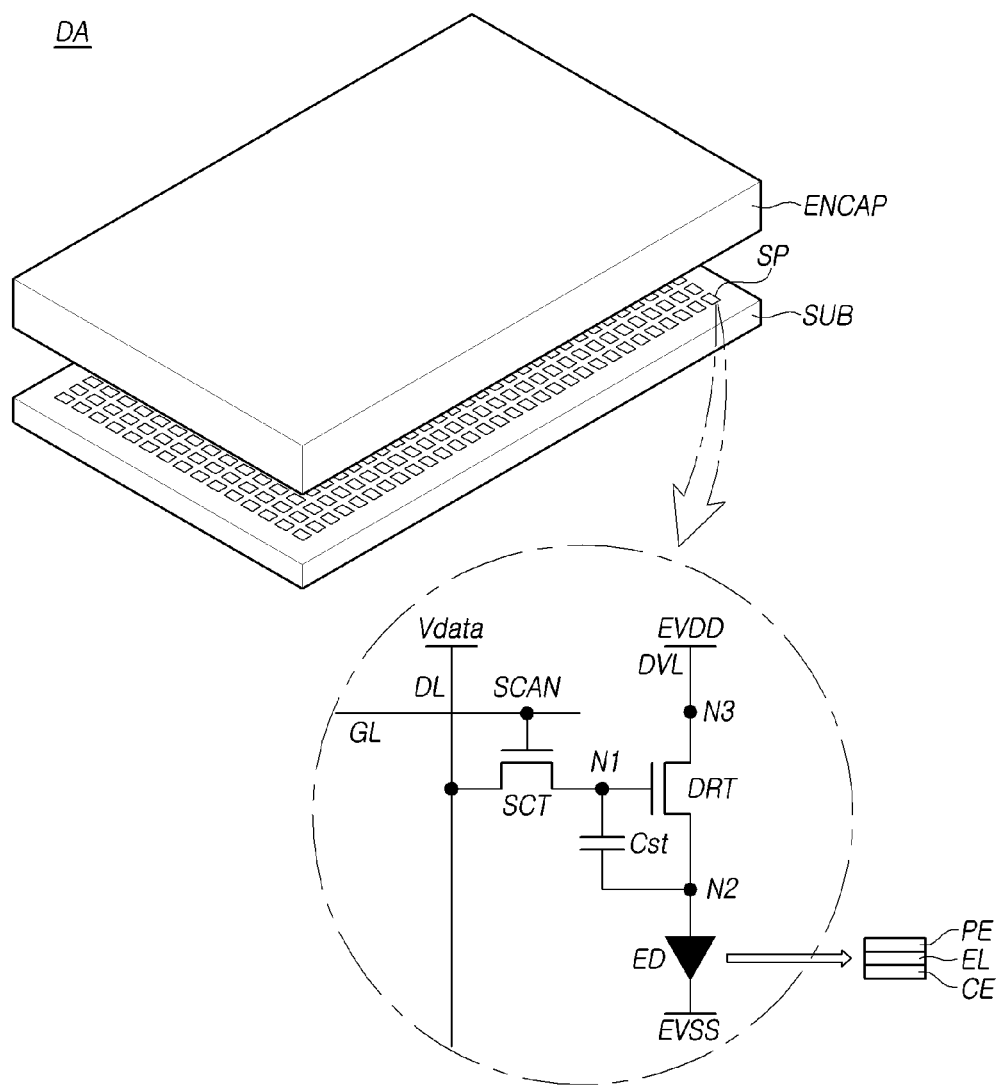
FIG. 2 is a view schematically illustrating a structure of a display panel of a touch display device according to embodiments of the disclosure.

FIG. 2 is a view schematically illustrating a structure of a display panel 110 of a touch display device 100 according to embodiments of the disclosure.

Referring to FIG. 2, the display panel 110 of the touch display device 100 may have a built-in touch panel (TSP).

In other words, in the touch display device 100, the touch panel (TSP) may be of a built-in type embedded in the display panel 110. The built-in touch panel (TSP) is also referred to as an in-cell type or on-cell type touch panel (TSP).

Each subpixel SP in the display area DA of the display panel 110 may include a light emitting element ED, a driving transistor DRT for driving the light emitting element ED, a scan transistor SCT for transferring a data voltage Vdata to a first node N1 of the driving transistor DRT, and a storage capacitor Cst for maintaining a constant voltage during one frame.

The driving transistor DRT may include the first node N1 to which the data voltage may be applied, a second node N2 electrically connected with the light emitting element ED, and a third node N3 to which a driving voltage EVDD is applied from a driving voltage line DVL. The first node N1 in the driving transistor DRT may be a gate node, the second node N2 may be a source node or a drain node, and the third node N3 may be the drain node or the source node.

The light emitting element ED may include a pixel electrode PE, a light emitting layer EL, and a common electrode CE. The pixel electrode PE may be disposed in each subpixel SP and may be electrically connected to the second node N2 of the driving transistor DRT of each subpixel SP. The common electrode CE may be jointly disposed in a plurality of subpixels SP, and a base voltage EVSS may be applied to the common electrode CE.

For example, the pixel electrode PE may be an anode electrode, and the common electrode CE may be a cathode electrode. Conversely, the pixel electrode PE may be a cathode electrode, and the common electrode CE may be an anode electrode. For convenience of description, it is assumed below that the pixel electrode PE may be an anode electrode, and the common electrode CE may be a cathode electrode. Accordingly, the pixel electrode PE may be referred to as an anode electrode PE, and the common electrode CE may be referred to as a cathode electrode CE. The base voltage EVSS applied to the common electrode CE is a type of a display driving voltage and is also referred to below as a display cathode voltage EVSS.

For example, the light emitting element ED may be an organic light emitting diode (OLED), an inorganic light emitting diode, or a quantum dot light emitting element. In this case, when the light emitting element ED is an organic light emitting diode, the light emitting layer EL of the light emitting element ED may include an organic light emitting layer including an organic material.

The scan transistor SCT may be on/off controlled by a scan signal SCAN, which is a gate signal, applied via the gate line GL and be electrically connected between the first node N1 of the driving transistor DRT and the data line DL.

The storage capacitor Cst may be electrically connected between the first node N1 and second node N2 of the driving transistor DRT.

Each subpixel SP may have a 2T (transistor)1C (capacitor) structure which includes two transistors DRT and SCT and one capacitor Cst as shown in FIG. 2 and, in some cases, each subpixel SP may further include one or more transistors or one or more capacitors.

The capacitor Cst may be an external capacitor intentionally designed to be outside the driving transistor DRT, but not a parasitic capacitor (e.g., Cgs or Cgd) which is an internal capacitor that may be present between the first node N1 and the second node N2 of the driving transistor DRT.

Each of the driving transistor DRT and the scan transistor SCT may be an n-type transistor or a p-type transistor.

Since the circuit elements (particularly, the light emitting element ED) in each subpixel SP are vulnerable to external moisture or oxygen, an encapsulation layer ENCAP may be disposed on the display panel 110 to prevent penetration of external moisture or oxygen into the circuit elements (particularly, the light emitting element ED).

Figure 3:
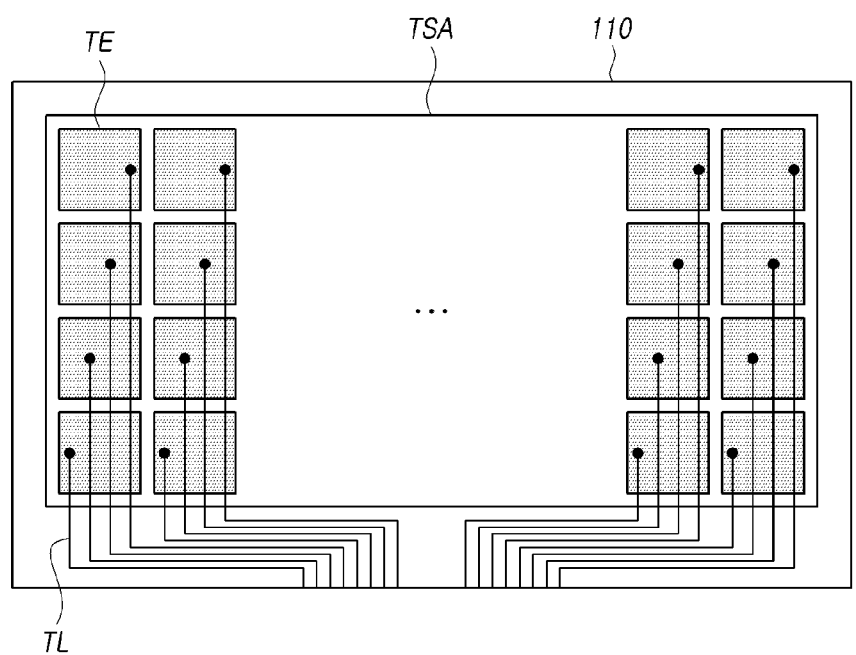
FIG. 3 is a view schematically illustrating a touch sensor structure of a touch display device according to embodiments of the disclosure.

FIG. 3 is a view schematically illustrating a touch sensor structure of a touch display device 100 according to embodiments of the disclosure.

Referring to FIG. 3, the touch display device 100 according to embodiments of the disclosure may include a touch sensor disposed in the touch sensing area TSA of the display panel 110.

Referring to FIG. 3, the touch sensor may include a plurality of touch electrodes TE separated from each other and disposed in the touch sensing area TSA.

Referring to FIG. 3, the touch sensor may further include a plurality of touch lines TL for electrically connecting each of the plurality of touch electrodes TE to the touch driving circuit 160. The touch lines TL are also referred to as touch routing lines.

Referring to FIG. 3, in the touch sensor, the plurality of touch electrodes TE does not electrically cross each other. In the self-capacitance type touch sensor, each of the plurality of touch electrodes TE may be one touch node corresponding to touch coordinates.

Referring to FIG. 3, for example, when the touch display device 100 senses a touch based on self-capacitance, the touch driving circuit 160 may supply a touch driving signal to at least one of the plurality of touch electrodes TE and may sense the touch electrode TE to which the touch driving signal is supplied.

Each of the plurality of touch electrodes TE may be an electrode without an opening or a mesh-type electrode having a plurality of openings.

Each of the plurality of touch electrodes TE may be a transparent electrode.

The sensing value for the touch electrode TE to which the touch driving signal is supplied may be a value corresponding to capacitance or a change in capacitance in the touch electrode TE to which the touch driving signal is supplied. The capacitance in the touch electrode TE to which the touch driving signal is supplied may be a capacitance between the touch electrode TE to which the touch driving signal is supplied and a touch object, such as a finger.

As described above, in the touch display device 100 according to embodiments of the disclosure, a touch sensor including a plurality of touch electrodes TE may be embedded in the display panel 110. Accordingly, during the manufacturing process of the display panel 110, when electrodes, lines, and patterns related to display driving are formed, the touch electrodes TE and the touch lines TL may also be formed.

Figure 4:
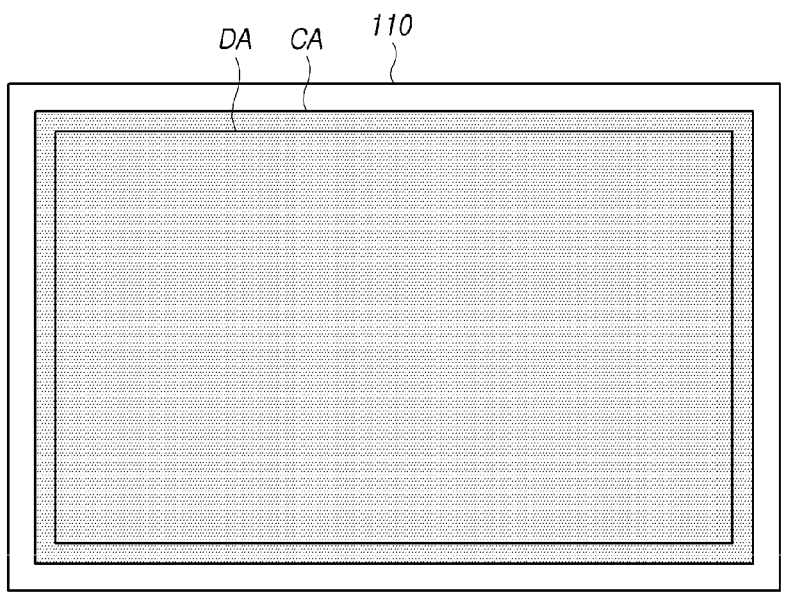
FIG. 4 is a plan view illustrating a display panel of a touch display device according to embodiments of the disclosure.

FIG. 4 is a plan view illustrating a display panel 110 of a touch display device 100 according to embodiments of the disclosure. FIGS. 5A, 5B, 6, and 7 are views illustrating a cathode electrode layer CEL and a touch sensor structure of a display panel 110 of a touch display device 100 according to embodiments of the disclosure.

Referring to FIG. 4, the display panel 110 of the touch display device 100 according to embodiments of the disclosure may include a display area DA in which images are displayed and a cathode electrode area CA overlapping the display area DA.

The cathode electrode area CA has the same area (size) as the display area DA in which case the cathode electrode area CA may completely overlap the display area DA.

Alternatively, as illustrated in FIG. 4, the cathode electrode area CA may have a larger area (size) than the display area DA. In this case, the cathode electrode area CA may include an area completely overlapping the display area DA and an area overlapping the non-display area NDA.

Figure 5A:
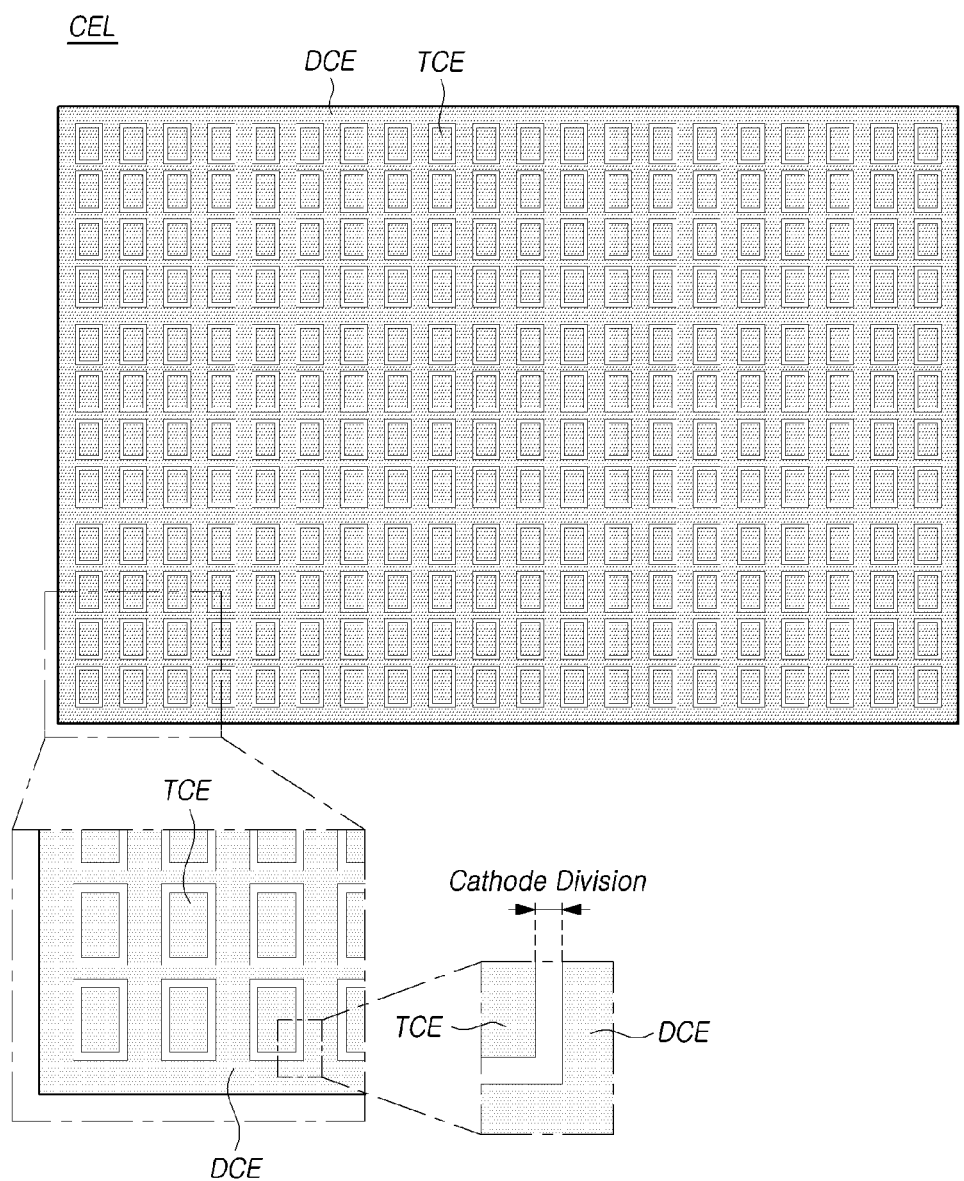
FIGS. 5A, 5B, 6, and 7 are views illustrating a cathode electrode layer and a touch sensor structure of a display panel of a touch display device according to embodiments of the disclosure.
Figure 5B:
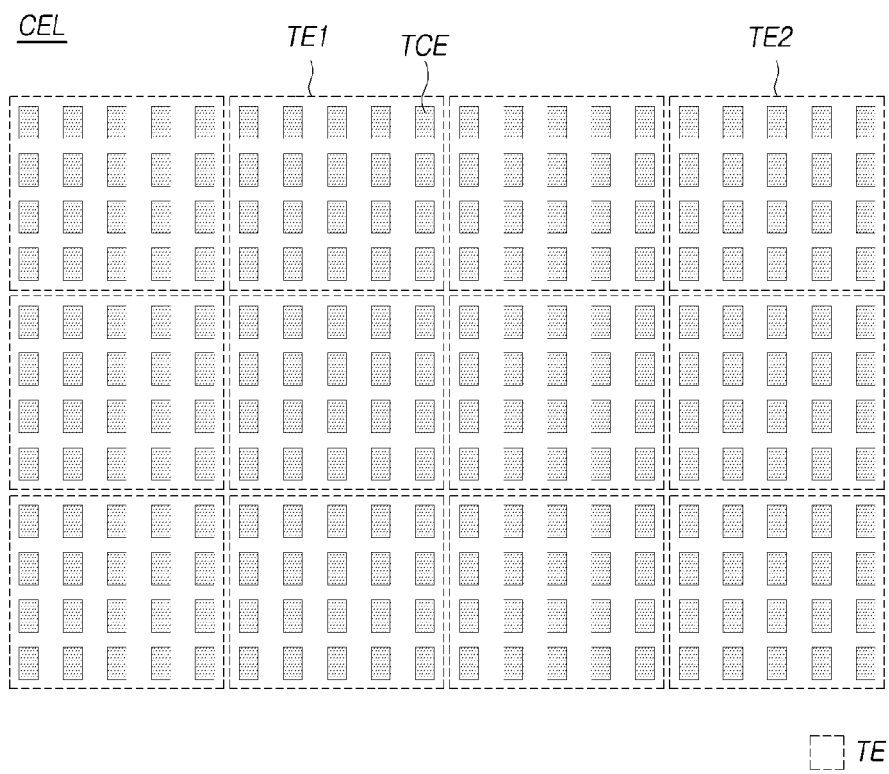

FIG. 5A illustrates a display cathode electrode DCE and a plurality of touch cathode electrodes TCE constituting a cathode electrode layer CEL disposed in the cathode electrode area CA. FIG. 5B illustrates only the plurality of touch cathode electrodes TCE without the display cathode electrode DCE among the display cathode electrode DCE and the plurality of touch cathode electrodes TCE constituting the cathode electrode layer CEL.

Referring to FIG. 5A, in the display panel 110 of the touch display device 100 according to embodiments of the disclosure, the cathode electrode layer CEL may be disposed in the cathode electrode area CA.

Referring to FIG. 5A, the cathode electrode layer CEL may include one or more display cathode electrodes DCE and a plurality of touch cathode electrodes TCE.

One or more display cathode electrodes DCE correspond to the common electrode CE of the light emitting elements ED of the plurality of subpixels SP. Accordingly, the display cathode voltage EVSS may be applied to the one or more display cathode electrodes DCE.

When the cathode electrode layer CEL includes the plurality of display cathode electrodes DCE, the display panel 110 may further include a display cathode line to electrically connect the plurality of display cathode electrodes DCE.

The display cathode line may be disposed in a layer different from the cathode electrode layer CEL.

Referring to FIG. 5A, the plurality of touch cathode electrodes TCE are disposed adjacent to one or more display cathode electrodes DCE but may be spaced apart from the adjacent display cathode electrode DCE. The plurality of touch cathode electrodes TCE may be electrically separated from one or more display cathode electrodes DCE.

Referring to FIG. 5A, the cathode electrode layer CEL may have a structure in which the display cathode electrode DCE and the touch cathode electrode TCE are electrically divided from each other. Such a structure is called a cathode division structure.

Referring to FIGS. 5A and 5B, the plurality of touch cathode electrodes TCE may constitute the plurality of touch electrodes TE.

Referring to FIGS. 5A and 5B, two or more touch cathode electrodes TCE among the plurality of touch cathode electrodes TCE may constitute one touch electrode TE.

In the example of FIG. 5B, 20 touch cathode electrodes TCE may constitute one touch electrode TE. The 20 touch cathode electrodes TCE may be arranged in 4 rows and 5 columns.

For a normal touch sensing operation, the 20 touch cathode electrodes TCE may be electrically connected to each other, constituting one touch electrode TE.

For a normal touch sensing operation, in the display panel 110, each of the plurality of touch electrodes TE should be electrically separated from another.

Accordingly, when the plurality of touch electrodes TE include a first touch electrode TE1 and a second touch electrode TE2 different from each other, the 20 touch cathode electrodes TCE constituting the first touch electrode TE1 may be electrically separated (insulated) from the 20 touch cathode electrodes TCE constituting the second touch electrode TE2.

The area (size) of each of the plurality of touch cathode electrodes TCE may be equal to the area (size) of one subpixel SP or its area.

Alternatively, the area (size) of each of the plurality of touch cathode electrodes TCE may be larger than the area (size) of one subpixel SP or its area. For example, the area (size) of each of the plurality of touch cathode electrodes TCE may correspond to the area (size) of two or more subpixels SP or their areas.

Referring to FIG. 5A, one or more subpixels SP or light emitting areas thereof may be disposed between two adjacent touch cathode electrodes TCE among the plurality of touch cathode electrodes TCE.

Referring to FIG. 5A, the display cathode electrode DCE, which is one type of display driving electrodes, or a portion thereof, may be disposed between two adjacent touch cathode electrodes TCE among the plurality of touch cathode electrodes TCE.

As described above, for a normal touch sensing operation, the plurality of touch electrodes TE are required to be electrically separated from each other in the display panel 110 while each of the plurality of touch electrodes TE should be electrically connected to the touch driving circuit 160.

Figure 6:
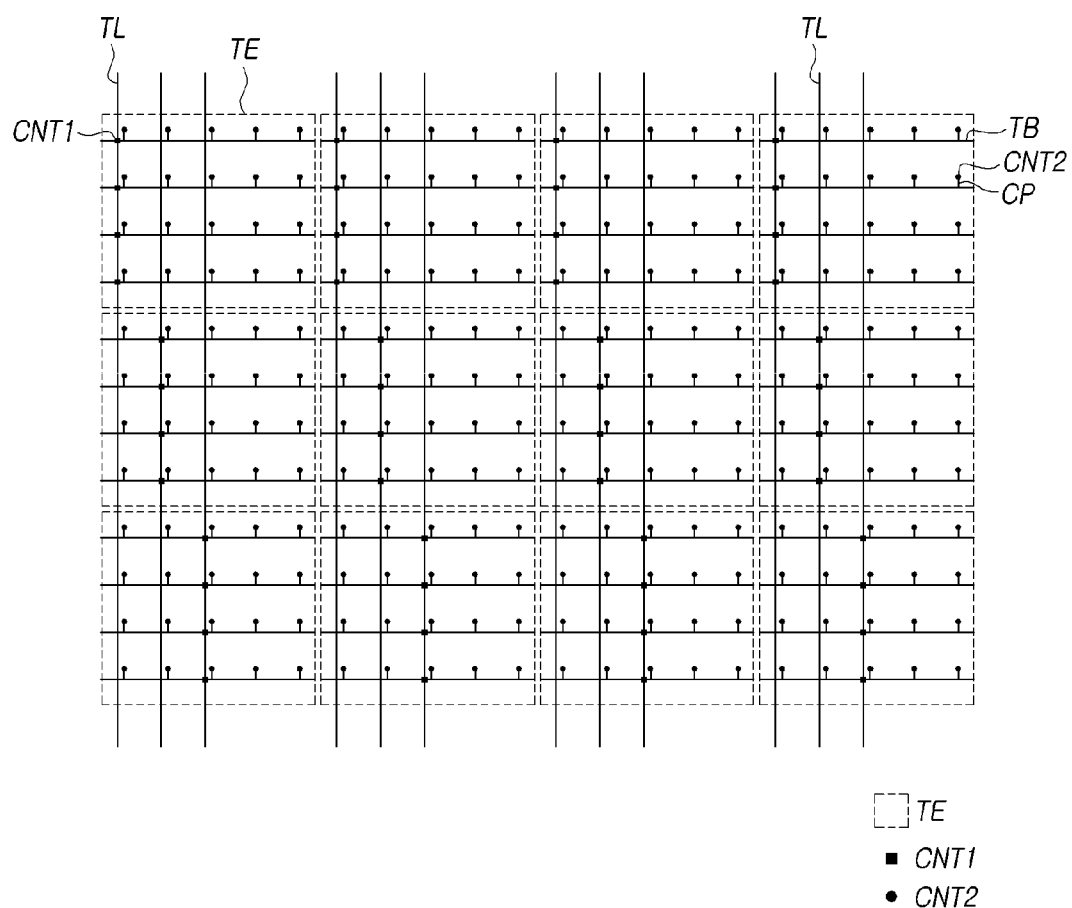

Such connection structure is described in view of touch cathode electrodes TCE. Referring to FIG. 6, two or more touch cathode electrodes TCE disposed in the area of one touch electrode TE should be electrically connected with each other. Two or more touch cathode electrodes TCE disposed in the area of one touch electrode TE and two or more touch cathode electrodes TCE disposed in the area of another touch electrode TE should be electrically separated from each other. Two or more touch cathode electrodes TCE disposed in the area of each touch electrode TE should be electrically connected to the touch driving circuit 160.

Figure 7:
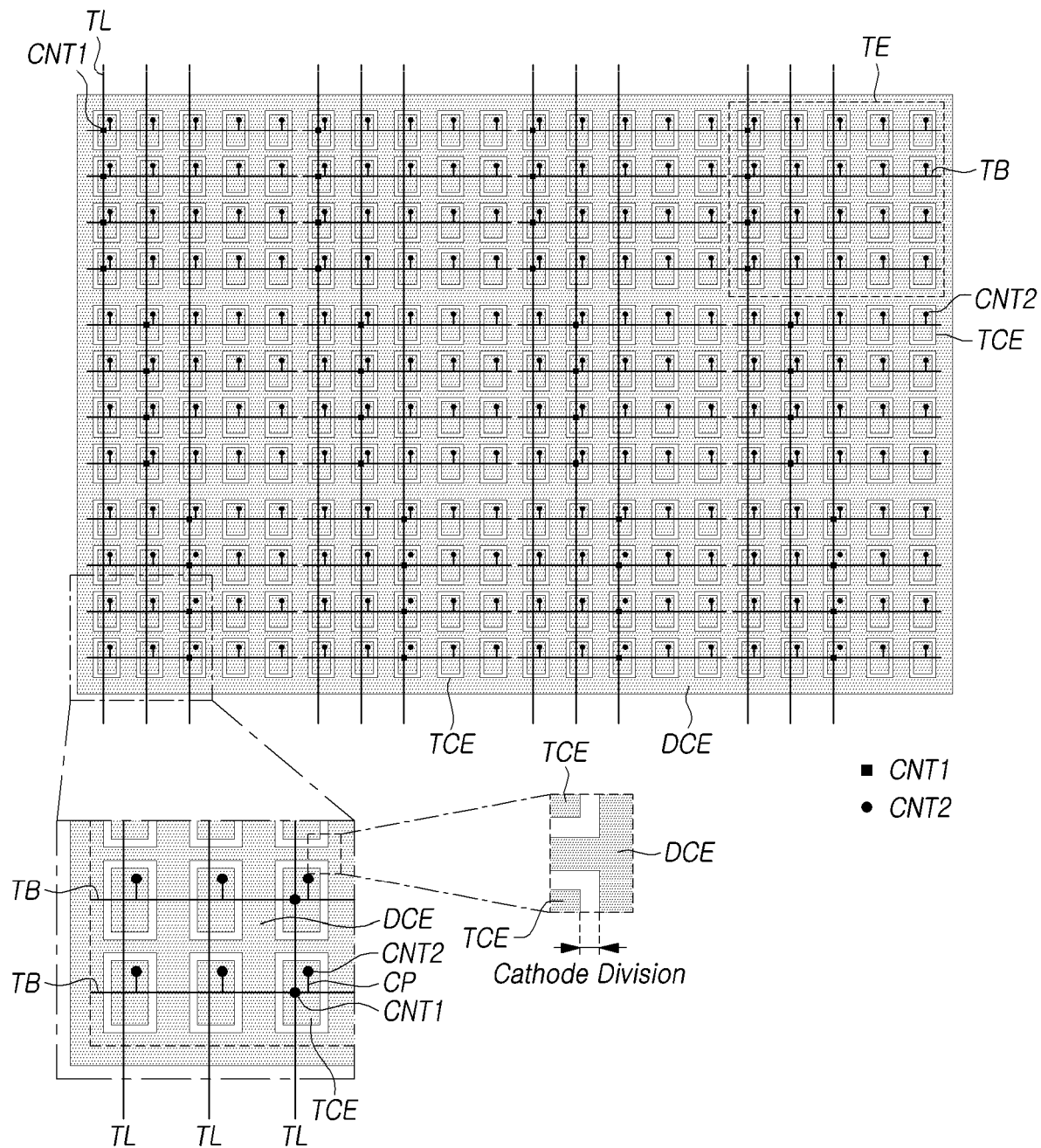

FIG. 6 illustrates only additional connection structures TL, TB, CP, CNT1, and CNT2 disposed in the cathode electrode area CA to form a touch sensor structure. However, for convenience of description, the cathode electrode layer CEL is omitted in FIG. 6. FIG. 7 is a plan view illustrating altogether the cathode electrode layer CEL of FIG. 5A and the connection structures TL, TB, CP, CNT1, and CNT2 of FIG. 6.

Referring to FIGS. 6 and 7, to form a touch sensor structure according to the above-described connection structure, the display panel 110 may include a plurality of touch lines TL and a plurality of touch bridges TB.

Referring to FIGS. 6 and 7, the plurality of touch lines TL may respectively correspond to the plurality of touch electrodes TE. The plurality of touch electrodes TE may be connected to the touch driving circuit 160 through the plurality of touch lines TL.

Referring to FIGS. 6 and 7, two or more touch bridges TB may be disposed in the area of each of the plurality of touch electrodes TE. In other words, two or more touch bridges TB may be disposed in the area of one touch electrode TE. In the example of FIGS. 6 and 7, four touch bridges TB are disposed in the area of one touch electrode TE.

Referring to FIGS. 6 and 7, the four touch bridges TB disposed in the area of one touch electrode TE may be connected with one touch line TL corresponding to one touch electrode TE through four first contact holes CNT1.

Referring to FIGS. 6 and 7, the four touch bridges TB disposed in the area of one touch electrode TE may be connected with 20 touch cathode electrodes TCE disposed in the area of one touch electrode TE through 20 connection patterns CP.

Referring to FIGS. 6 and 7, each of the four touch bridges TB disposed in the area of one touch electrode TE may be connected with five touch cathode electrodes TCE through five connection patterns CP.

Referring to FIGS. 6 and 7, five connection patterns CP corresponding to one touch bridge TB may be integrated with one touch bridge TB. In other words, the five connection patterns corresponding to one touch bridge TB may be portions of the one touch bridge TB.

Alternatively, the five connection patterns CP corresponding to one touch bridge TB may be other electrodes connected with the one touch bridge TB. The five connection patterns CP may be positioned in a different layer from the one touch bridge TB.

Referring to FIGS. 6 and 7, five connection patterns CP corresponding to one touch bridge TB may connected with five touch cathode electrodes TCE, respectively, through five second contact holes CNT2.

Referring to FIGS. 6 and 7, a first contact hole CNT1 may be a point for connecting the touch line TL with the touch bridge TB, and the second contact hole CNT2 may be a point for connecting the connection pattern CP connected with the touch bridge TB with the touch cathode electrode TCE.

An example of the above-described touch sensor structure is described again with reference to FIGS. 6 and 7.

Referring to FIGS. 6 and 7, when one touch electrode TE is composed of 20 touch cathode electrodes TCE arrayed in 4 rows and 5 columns, the 20 touch cathode electrodes TCE disposed in the area of the one touch electrode TE may include five touch cathode electrodes TCE disposed in a first row, five touch cathode electrodes TCE disposed in a second row, five touch cathode electrodes TCE disposed in a third row, and five touch cathode electrodes TCE disposed in a fourth row.

Referring to FIGS. 6 and 7, when one touch electrode TE is composed of 20 touch cathode electrodes TCE arrayed in 4 rows and 5 columns, four touch bridges TB may be disposed in the area of the one touch electrode TE.

Referring to FIGS. 6 and 7, the four touch bridges TB may include one touch bridge TB corresponding to the five touch cathode electrodes TCE disposed in the first row, one touch bridge TB corresponding to the five touch cathode electrodes TCE disposed in the second row, one touch bridge TB corresponding to the five touch cathode electrodes TCE disposed in the third row, and one touch bridge TB corresponding to the five touch cathode electrodes TCE disposed in the fourth row.

Referring to FIGS. 6 and 7, the five touch cathode electrodes TCE disposed in the first row may be connected with the touch bridge TB disposed in the first row through five connection patterns CP in five second contact holes CNT2. The five touch cathode electrodes TCE disposed in the second row may be connected with the touch bridge TB disposed in the second row through five connection patterns CP in five second contact holes CNT2. The five touch cathode electrodes TCE disposed in the third row may be connected with the touch bridge TB disposed in the third row through five connection patterns CP in five second contact holes CNT2. The five touch cathode electrodes TCE disposed in the fourth row may be connected with the touch bridge TB disposed in the fourth row through five connection patterns CP in five second contact holes CNT2.

Referring to FIGS. 6 and 7, the touch bridges TB disposed in the first to fourth rows may be connected with one touch line TL corresponding to one touch electrode TE through four first contact holes CNT1.

According to the above-described touch sensor structure, 20 touch cathode electrodes TCE arranged in 4 rows and 5 columns may constitute one touch electrode TE.

Figure 8:
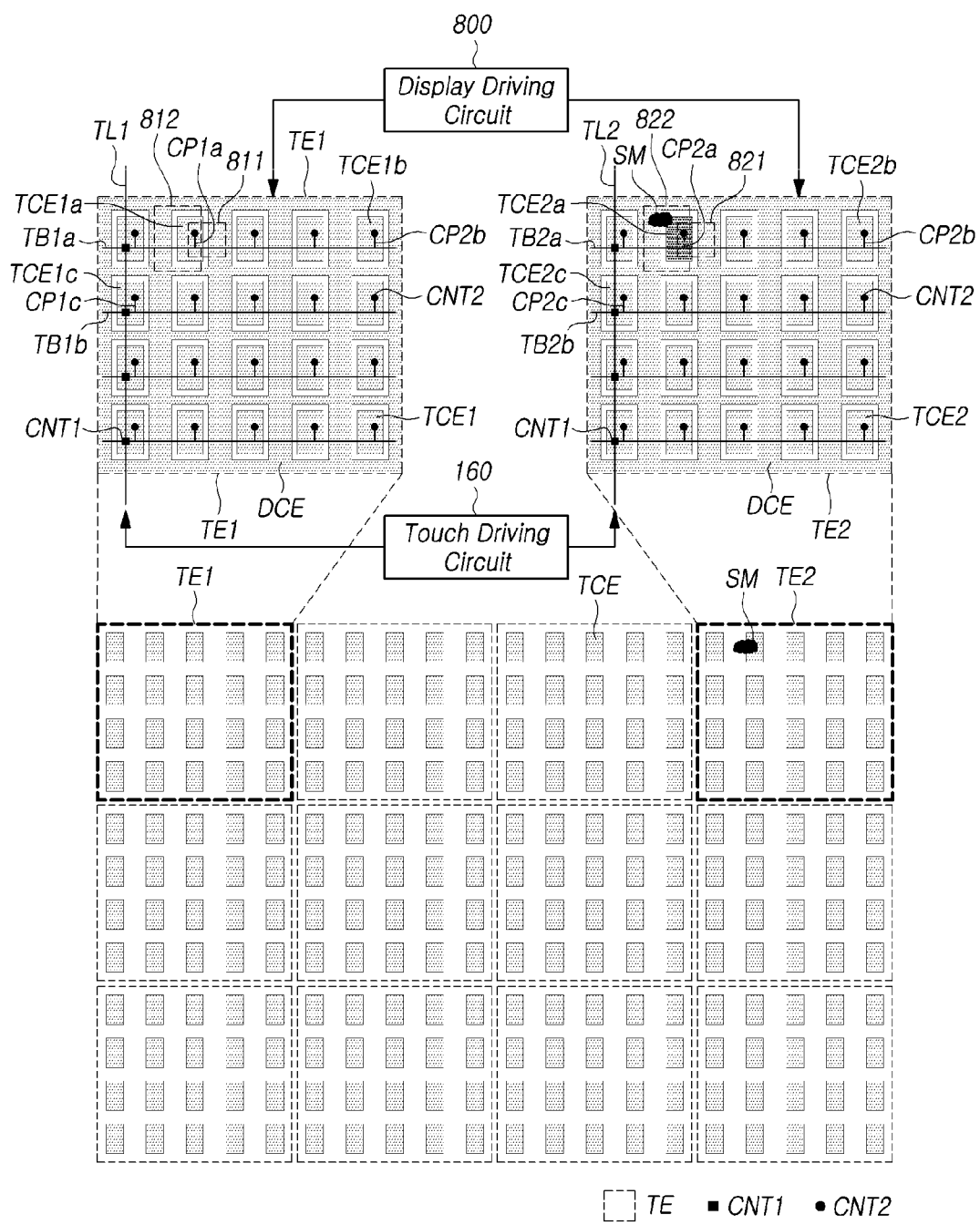
FIG. 8 is a view illustrating a touch sensor structure for a first touch electrode and a second touch electrode in a display panel of a touch display device according to embodiments of the disclosure.
Figure 9:
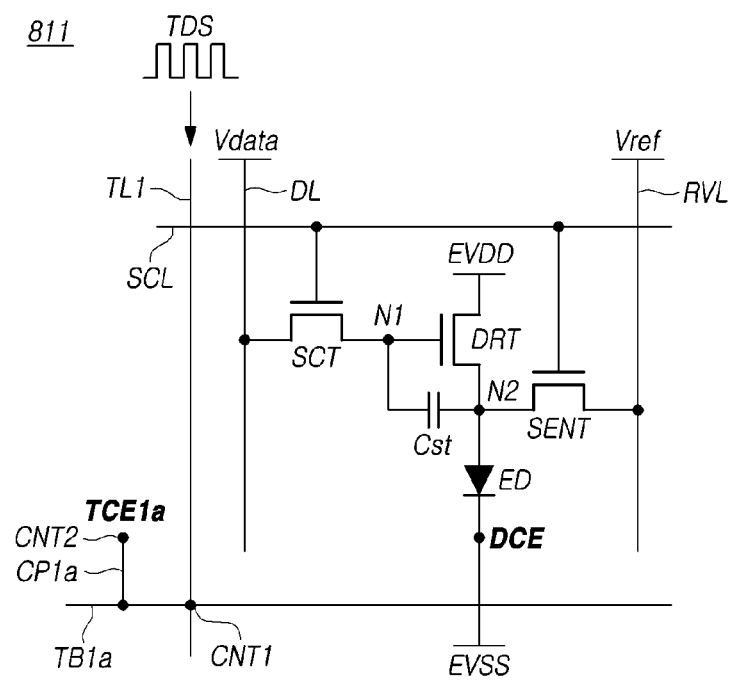
FIG. 9 is an equivalent circuit of a first partial area in an area of a first touch electrode in a display panel of a touch display device according to embodiments of the disclosure.
Figure 10A:
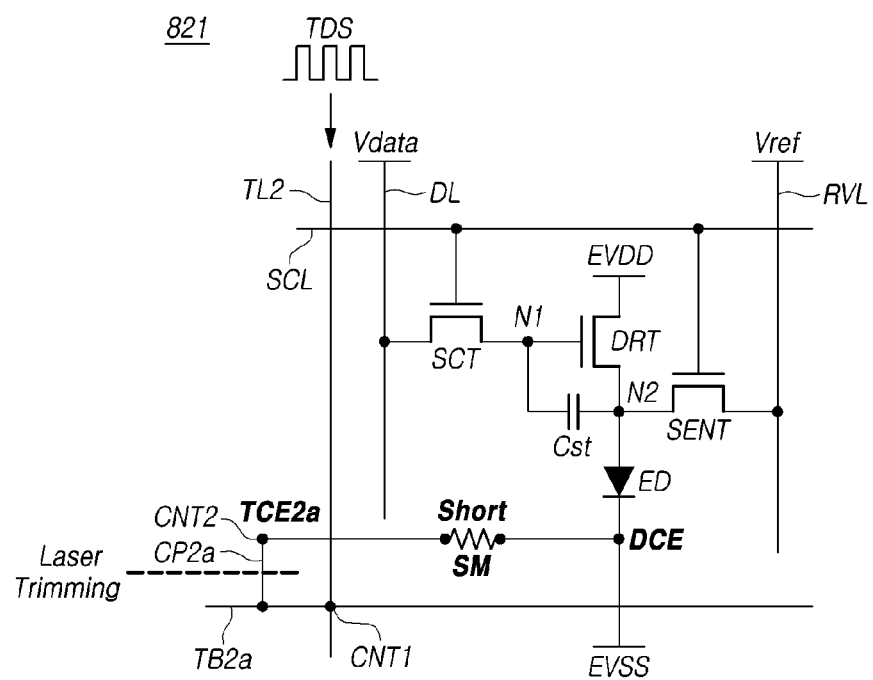
FIGS. 10A and 10B are equivalent circuits for a first partial area in an area of a second touch electrode in a display panel of a touch display device according to embodiments of the disclosure.
Figure 10B:
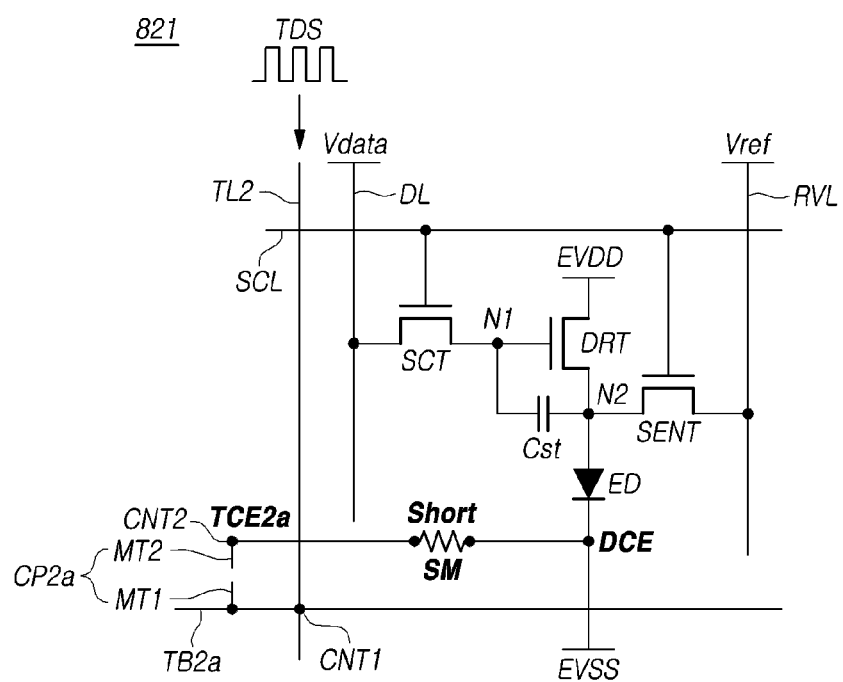

FIG. 8 illustrates a touch sensor structure for a first touch electrode TE1 and a second touch electrode TE2 in a display panel 110 of a touch display device 100 according to embodiments of the disclosure. FIG. 9 is an equivalent circuit for a first partial area 811 in the area of the first touch electrode TE1 in FIG. 8. FIGS. 10A and 10B are equivalent circuits for a first partial area 821 in the area of the second touch electrode TE2 in FIG. 8.

Referring to FIG. 8, the touch display device 100 according to embodiments of the disclosure may include a display panel 110 including a plurality of subpixels SP and a plurality of touch electrodes TE, a display driving circuit 800 for driving the plurality of subpixels SP, and a touch driving circuit 160 for driving the plurality of touch electrodes TE.

The touch display device 100 according to embodiments of the disclosure is a display of a type in which a touch sensor is embedded in the display panel 110.

In the display panel 110, the touch sensor may have a cathode division structure.

Accordingly, in the display panel 110, the cathode electrode layer CEL may include one or more display cathode electrodes DCE and a plurality of touch cathode electrodes TCE.

The one or more display cathode electrodes DCE may be positioned in the same layer as the plurality of touch cathode electrodes TCE constituting each of the plurality of touch electrodes TE.

The one or more display cathode electrodes DCE may receive a display cathode voltage EVSS from the display driving circuit 800.

The display driving circuit 800 may include a power supply circuit for supplying the display cathode voltage EVSS. The display driving circuit 800 may further include one or more of the data driving circuit 120, the gate driving circuit 130, and the display controller 140.

Each of the plurality of touch cathode electrodes TCE may receive a touch driving signal TDS from the touch driving circuit 160 or may be sensed by the touch driving circuit 160.

That the touch driving circuit 160 senses the touch cathode electrode TCE may mean detecting a signal at the touch cathode electrode TCE, detecting the amount of charge or a variation in the amount of charge at the touch cathode electrode TCE, or detecting the capacitance or a variation in capacitance at the touch cathode electrode TCE.

By the touch sensor structure according to the cathode division structure, each of the plurality of touch electrodes TE may be composed of a plurality of touch cathode electrodes TCE electrically connected to each other.

The plurality of touch electrodes TE may include a first touch electrode TE1 and a second touch electrode TE2. Hereinafter, to describe the touch sensor structure according to embodiments of the disclosure, the first touch electrode TE1 and the second touch electrode TE2 are exemplified.

The display panel 110 of the touch display device 100 according to embodiments of the disclosure may include one or more display cathode electrodes DCE and a touch sensor structure.

The display panel 110 of the touch display device 100 according to embodiments of the disclosure may include 20 touch cathode electrodes TCE1, as the first touch electrode structure disposed in the area of the first touch electrode TE1.

The 20 touch cathode electrodes TCE1 disposed in the area of the first touch electrode TE1 may include the first touch cathode electrode TCE1a.

The display panel 110 of the touch display device 100 according to embodiments of the disclosure may further include a first touch line TL1 as the first touch electrode structure disposed in the area of the first touch electrode TE1.

The display panel 110 of the touch display device 100 according to embodiments of the disclosure may further include four touch bridges TB connected with the first touch line TL1, as the first touch electrode structure disposed in the area of the first touch electrode TE1.

The four touch bridges TB may include a first touch bridge TB1a for connecting the first touch cathode electrode TCE1a and the first touch line TL1.

The display panel 110 of the touch display device 100 according to embodiments of the disclosure may include 20 touch cathode electrodes TCE2, as the second touch electrode structure disposed in the area of the second touch electrode TE2.

The 20 touch cathode electrodes TCE2 disposed in the area of the second touch electrode TE2 may include the second touch cathode electrode TCE2a.

The display panel 110 of the touch display device 100 according to embodiments of the disclosure may further include a second touch line TL2 as the second touch electrode structure disposed in the area of the second touch electrode TE2.

The display panel 110 of the touch display device 100 according to embodiments of the disclosure may further include four touch bridges TB connected with the second touch line TL2, as the second touch electrode structure disposed in the area of the second touch electrode TE2.

The four touch bridges TB may include a second touch bridge TB2a for connecting the second touch cathode electrode TCE2a and the second touch line TL2.

One or more display cathode electrodes DCE may be disposed in the cathode electrode layer CEL in the cathode electrode area CA.

The display cathode voltage EVSS may be applied to the one or more display cathode electrodes DCE.

The first touch cathode electrode TCE1a may be disposed in the same cathode electrode layer CEL as the display cathode electrode DCE and may be disposed adjacent to the display cathode electrode DCE.

The first touch line TL1 may be connected to the touch driving circuit 160. The first touch bridge TB1a may be connected to the first touch line TL1. In other words, the first touch bridge TB1a may be connected to the touch driving circuit 160 through the first touch line TL1.

The second touch cathode electrode TCE2a may be disposed in the same cathode electrode layer CEL as the display cathode electrode DCE and may be disposed adjacent to the display cathode electrode DCE.

The second touch line TL2 may be connected to the touch driving circuit 160.

The second touch bridge TB2a may be connected to the second touch line TL2. The second touch bridge TB2a may be connected to the touch driving circuit 160 through the second touch line TL2.

Referring to FIG. 8, the first touch cathode electrode TCE1a may be electrically separated from the display cathode electrode DCE.

The first touch bridge TB1a may be connected to the first touch cathode electrode TCE1a. Accordingly, the first touch line TL1 and the first touch cathode electrode TCE1a may be electrically connected through the first touch bridge TB1a.

Referring to FIG. 8, the second touch cathode electrode TCE2a may be electrically shorted to the display cathode electrode DCE.

The second touch bridge TB2a may be electrically separated from the second touch cathode electrode TCE2a. Accordingly, the second touch line TL2 and the second touch cathode electrode TCE2a may not be electrically connected by the second touch bridge TB2a but may be electrically separated from each other.

Referring to FIG. 8, the display panel 110 may further include a first connection pattern CP1a for connecting the first touch bridge TB1a and the first touch cathode electrode TCE1a.

Referring to FIG. 8, the first connection pattern CP1a may be integrated with the first touch bridge TB1a. In other words, the first connection pattern CP1a may be a portion of the first touch bridge TB1a.

Alternatively, the first connection pattern CP1a may be another electrode connected to the first touch bridge TB1a. The first connection pattern CPla may be positioned in a different layer from the first touch bridge TB1a.

Referring to FIG. 8, the first touch bridge TB1a may be disposed in a direction crossing the first touch line TL1.

Referring to FIG. 8, the first connection pattern CP1a may protrude from the first touch bridge TB1a.

Referring to FIGS. 8 and 10B, the display panel 110 may further include a first metal MT1 connected to the second touch bridge TB2a and a second metal MT2 connected to the second touch cathode electrode TCE2a.

The first metal MT1 may be connected to the second touch bridge TB2a in the first contact hole CNT1 and may also be connected to the second touch line TL2.

In other words, the first contact hole CNT1 may be a connection point between the second touch line TL2 and the second touch bridge TB2a and may be a connection point between the second touch bridge TB2a and the first metal MT1.

The first metal MT1 may be integral with the second touch bridge TB2a and may be a portion protruding from the second touch bridge TB2a.

The second metal MT2 may be connected to the second touch cathode electrode TCE2a in the second contact hole CNT2.

The first metal MT1 and the second metal MT2 may be spaced apart from each other and positioned in the same layer.

The first metal MT1 and the second metal MT2 may include the same material as the first connection pattern CP1a.

The first metal MT1 and the second metal MT2 may be two partial metals in which one connection pattern is broken.

Referring to FIG. 8, the display panel 110 may further include a third touch cathode electrode TCE1b that is disposed in the same cathode electrode layer CEL as the display cathode electrode DCE and adjacent to the display cathode electrode DCE.

The third touch cathode electrode TCE1b may be electrically separated from the display cathode electrode DCE.

The first touch bridge TB1a may be connected to the third touch cathode electrode TCE1b.

The first touch line TL1 may be electrically connected to the first touch cathode electrode TCE1a and the third touch cathode electrode TCE1b through the first touch bridge TB1a.

The display panel 110 may further include a third connection pattern CP2b for connecting the first touch bridge TB1a and the third touch cathode electrode TCE1b.

Referring to FIG. 8, the display panel 110 may further include a fourth touch cathode electrode TCE2b that is disposed in the same cathode electrode layer CEL as the display cathode electrode DCE and adjacent to the display cathode electrode DCE.

The fourth touch cathode electrode TCE2b may be electrically separated from the display cathode electrode DCE.

The second touch bridge TB2a may be connected to the fourth touch cathode electrode TCE2b.

The second touch line TL2 may be electrically connected to the fourth touch cathode electrode TCE2b of the second touch cathode electrode TCE2a and the fourth touch cathode electrode TCE2b through the second touch bridge TB2a.

In other words, the second touch line TL2 is not electrically connected to the second touch cathode electrode TCE2a through the second touch bridge TB2a but may be electrically connected to the fourth touch cathode electrode TCE2b through the second touch bridge TB2a.

The display panel 110 may further include a fourth connection pattern CP2b for connecting the second touch bridge TB2a and the fourth touch cathode electrode TCE2b.

Referring to FIG. 8, the display panel 110 may further include a fifth touch cathode electrode TCE1c that is disposed in the same cathode electrode layer CEL as the display cathode electrode DCE and adjacent to the display cathode electrode DCE.

The display panel 110 may further include a third touch bridge TB1b connected to the first touch line TL1.

The fifth touch cathode electrode TCE1c may be electrically separated from the display cathode electrode DCE.

The third touch bridge TB1b may be connected to the fifth touch cathode electrode TCE1c. Accordingly, the first touch line TL1 and the fifth touch cathode electrode TCE1c may be electrically connected to each other through the third touch bridge TB1b.

Referring to FIG. 8, the display panel 110 may further include a fifth connection pattern CP1c for connecting the third touch bridge TB1b and the fifth touch cathode electrode TCE1c.

Referring to FIG. 8, the display panel 110 may further include a sixth touch cathode electrode TCE2c that is disposed in the same cathode electrode layer CEL as the display cathode electrode DCE and adjacent to the display cathode electrode DCE.

The display panel 110 may further include a fourth touch bridge TB2b connected to the second touch line TL2.

The sixth touch cathode electrode TCE2c may be electrically separated from the display cathode electrode DCE.

The fourth touch bridge TB2b may be connected to the sixth touch cathode electrode TCE2c. Accordingly, the second touch line TL2 and the sixth touch cathode electrode TCE2c may be electrically connected to each other through the fourth touch bridge TB2b.

Referring to FIG. 8, the display panel 110 may further include a sixth connection pattern CP2c for connecting the fourth touch bridge TB2b and the sixth touch cathode electrode TCE2c.

Referring to FIG. 8, a shorting material SM may exist between the second touch cathode electrode TCE2a and the display cathode electrode DCE.

The second touch cathode electrode TCE2a and the display cathode electrode DCE may be in a state of having been shorted by the shorting material SM.

For example, the shorting material SM may include at least one of a foreign material, such as fine dust, an organic material, and a cathode electrode material.

Referring to FIGS. 8 and 2 together, the display panel 110 may include an encapsulation layer ENCAP disposed on the display cathode electrode DCE, a plurality of light emitting layers EL disposed under the display cathode electrode DCE, and a plurality of pixel electrodes PE disposed under the plurality of light emitting layers EL. In other words, the first touch cathode electrode TCE1a and the second touch cathode electrode TCE2a which are electrodes serving as the touch sensor may be disposed under the encapsulation layer ENCAP.

The first touch line TL1 and the second touch line TL2 may be disposed under the cathode electrode layer CEL where the display cathode electrode DCE, the first touch cathode electrode TCE1a, and the second touch cathode electrode TCE2a are disposed.

For example, the first touch line TL1 and the second touch line TL2 may be disposed between the cathode electrode layer CEL and the source-drain material layer. The source-drain material layer may be a layer where data lines DL are disposed.

Of the first touch electrode structure and the second touch electrode structure described above in connection with FIG. 8, only differences between the first touch electrode structure and the second touch electrode structure are described below with reference to FIGS. 9, 10A, and 10B.

Referring to FIGS. 10A and 10B, each of the plurality of subpixels SP may include a light emitting element ED, a driving transistor DRT, a scan transistor SCT, a sensing transistor SENT, and a storage capacitor Cst.

The light emitting element ED may include a pixel electrode PE, a display cathode electrode DCE, and a light emitting layer EL. The light emitting layer EL may be disposed between the pixel electrode PE and the display cathode electrode DCE.

The driving transistor DRT is a transistor for driving the light emitting element ED.

The scan transistor SCT may be a transistor for switching the connection between the first node N1, which is the gate node of the driving transistor DRT, and the data line DL.

The scan transistor SCT may receive the scan signal SCAN supplied through the scan signal line SCL, which is a type of the gate line GL, through the gate node and be turned on or off by the scan signal SCAN.

The sensing transistor SENT may be a transistor for switching the connection between the second node N2, which is the source node or drain node of the driving transistor DRT, and the reference voltage line RVL. The reference voltage line RVL is a signal line for supplying a reference voltage Vref to the subpixel SP.

The gate node of the scan transistor SCT and the gate node of the sensing transistor SENT may be connected with different gate lines GL.

Alternatively, the gate node of the scan transistor SCT and the gate node of the sensing transistor SENT may be commonly connected to the same gate line GL.

The equivalent circuits of FIGS. 9, 10A, and 10B are equivalent circuits exemplifying a structure in which the gate node of the scan transistor SCT and the gate node of the sensing transistor SENT are connected to the same gate line GL as an example.

The storage capacitor Cst may be electrically connected between the first node N1 and second node N2 of the driving transistor DRT.

Referring to FIG. 9, the first connection pattern CP1*a* may remain in an unbroken state in the first partial area 811 in the area of the first touch electrode TE1.

Accordingly, the first touch cathode electrode TCE1*a* and the first touch bridge TB1a may be electrically connected by the first connection pattern CP1*a*. A point where the first touch cathode electrode TCE1*a* and the first connection pattern CP1*a* are connected is the second contact hole CNT2.

The first touch bridge TB1*a* may be electrically connected to the first touch line TL1 through the first contact hole CNT1.

Accordingly, the first touch cathode electrode TCE1a may be electrically connected to the first touch line TL1 through the first connection pattern CP1*a* and the first touch bridge TB1*a*.

For touch sensing, the touch driving signal TDS output from the touch driving circuit 160 may be supplied to the first touch line TL1. The touch driving signal TDS may be a signal whose voltage level varies.

The touch driving signal TDS supplied to the first touch line TL1 may be applied to the first touch cathode electrode TCE1*a* through the first touch bridge TB1*a* and the first connection pattern CP1*a*.

Conversely, the touch driving circuit 160 may detect the electrical state (voltage, amount of charge, or capacitance) of the first touch cathode electrode TCE1*a* through the first connection pattern CP1*a*, the first touch bridge TB1*a*, and the first touch line TL1.

Referring to FIG. 10A, in the first partial area 821 in the area of the second touch electrode TE2, the second touch cathode electrode TCE2*a* and the display cathode electrode DCE may be in a state of having been shorted by the shorting material SM.

Accordingly, when the touch driving signal TDS is applied to the second touch cathode electrode TCE2*a*, the touch driving signal TDS may be transferred to the display cathode electrode DCE shorted with the second touch cathode electrode TCE2*a*.

For this reason, the display cathode electrode DCE may not maintain the display cathode voltage EVSS for driving the subpixel SP (display driving) but has an abnormal voltage state due to the transferred touch driving signal TDS.

Accordingly, the corresponding subpixel SP may not perform a normal driving operation but may cause abnormal light emission or may fail to emit light. As a result, the image quality of the display panel 110 may be degraded.

Accordingly, when the second touch cathode electrode TCE2*a* and the display cathode electrode DCE are in a state of having been shorted by the shorting material SM in the first partial area 821 in the area of the second touch electrode TE2, the second connection pattern CP2*a* may remain broken by laser trimming in the first partial area 821 in the area of the second touch electrode TE2 as shown in FIG. 10B.

In other words, the second connection pattern CP2*a* may remain separated into the first metal MT1 connected with the second touch bridge TB2*a* and the second metal MT2 connected with the second touch cathode electrode TCE2*a*.

The first metal MT1 and the second metal MT2 may be spaced apart from each other and electrically separated from each other.

The first metal MT1 may be connected to the second touch bridge TB2*a* in the first contact hole CNT1 and may also be connected to the second touch line TL2. In other words, the first contact hole CNT1 may be a connection point between the second touch line TL2 and the second touch bridge TB2*a* and may be a connection point between the second touch bridge TB2*a* and the first metal MT1.

The first metal MT1 may be integral with the second touch bridge TB2*a* and may be a portion protruding from the second touch bridge TB2*a*. The second metal MT2 may be connected to the second touch cathode electrode TCE2*a* in the second contact hole CNT2.

The first metal MT1 and the second metal MT2 may be spaced apart from each other and positioned in the same layer. The first metal MT1 and the second metal MT2 may include the same material as the first connection pattern CP1*a*. The first metal MT1 and the second metal MT2 may be two partial metals in which one connection pattern is broken.

Accordingly, the second touch cathode electrode TCE2*a* and the second touch bridge TB2*a* may not be electrically connected but may be electrically separated from each other. Accordingly, the second touch cathode electrode TCE2*a* is not electrically connected to the second touch line TL2 and the touch driving circuit 160 but may be electrically separated from the second touch line TL2 and the touch driving circuit 160.

Accordingly, the second touch cathode electrode TCE2*a* may not become the touch cathode electrode TCE constituting the second touch electrode TE2.

Rather, since the second touch cathode electrode TCE2*a* is in a state of having been shorted with the display cathode electrode DCE, the second touch cathode electrode TCE2*a* may act as a portion of the display cathode electrode DCE.

According to the foregoing description, the number of the plurality of touch cathode electrodes TCE1 constituting the first touch electrode TE1 and electrically connected to each other may differ from the number of the plurality of touch cathode electrodes TCE2 constituting the second touch electrode TE2 and electrically connected to each other.

According to the example of FIG. 8, the number of the plurality of touch cathode electrodes TCE2 constituting the second touch electrode TE2 and electrically connected to each other may be smaller than the number of the plurality of touch cathode electrodes TCE1 constituting the first touch electrode TE1 and electrically connected to each other.

According to the example of FIG. 8, the display panel 110 may include a second touch cathode electrode TCE2*a* that is electrically shorted with the display cathode electrode DCE.

The second touch cathode electrode TCE2*a* electrically shorted with the display cathode electrode DCE may be disposed in the area of the second touch electrode TE2.

However, the second touch cathode electrode TCE2*a* electrically shorted with the display cathode electrode DCE may fail to constitute the second touch electrode TE2 and may be electrically separated from the plurality of touch cathode electrodes TCE2 constituting the second touch electrode TE2.

According to the example of FIG. 8, the number of the plurality of touch cathode electrodes TCE1 constituting the first touch electrode TE1 and electrically connected to each other may be 20, and the number of the plurality of touch cathode electrodes TCE2 constituting the second touch electrode TE2 and electrically connected to each other may be 19.

The difference in number may vary depending on the position and number of shorting materials SM.

The display panel 110 may include a first touch line TL1 and a second touch line TL2.

The first touch line TL1 may electrically connect the touch driving circuit 160 with the plurality of touch cathode electrodes TCE1 constituting the first touch electrode TE1 and electrically connected to each other.

The second touch line TL2 may electrically connect the touch driving circuit 160 with the plurality of touch cathode electrodes TCE2 constituting the second touch electrode TE2 and electrically connected to each other.

The display panel 110 may include one or more first touch bridges TB1a and one or more second touch bridges TB2a.

The one or more first touch bridges TB1a may electrically connect the first touch line TL1 with the plurality of touch cathode electrodes TCE1 constituting the first touch electrode TE1 and electrically connected to each other.

The one or more second touch bridges TB2a may electrically connect the second touch line TL2 with the plurality of touch cathode electrodes TCE2 constituting the second touch electrode TE2 and electrically connected to each other.

The touch display device 100 according to embodiments of the disclosure may be a transparent touch display device. As such, even when the touch display device 100 according to embodiments of the disclosure is a transparent touch display device, the above-described touch sensor structure may be equally applied.

Accordingly, for the case where the touch display device 100 is a transparent touch display device, the above-described touch sensor structure is briefly described again. The description focuses on differences that may be made by the transparent touch display device.

Figure 11:
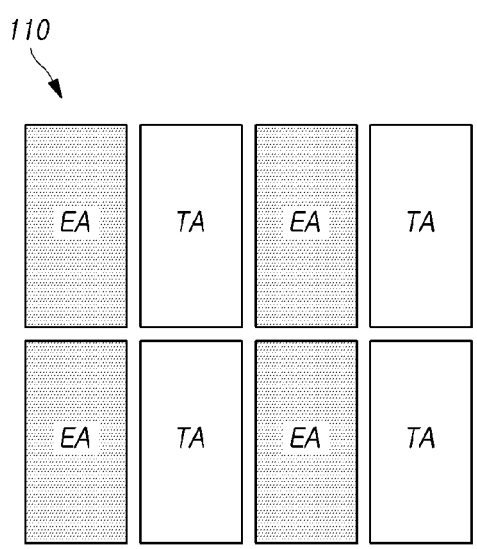
FIG. 11 is a view illustrating light emitting areas and transmissive areas in a display panel when a touch display device is a transparent touch display device according to embodiments of the disclosure.
Figure 12:
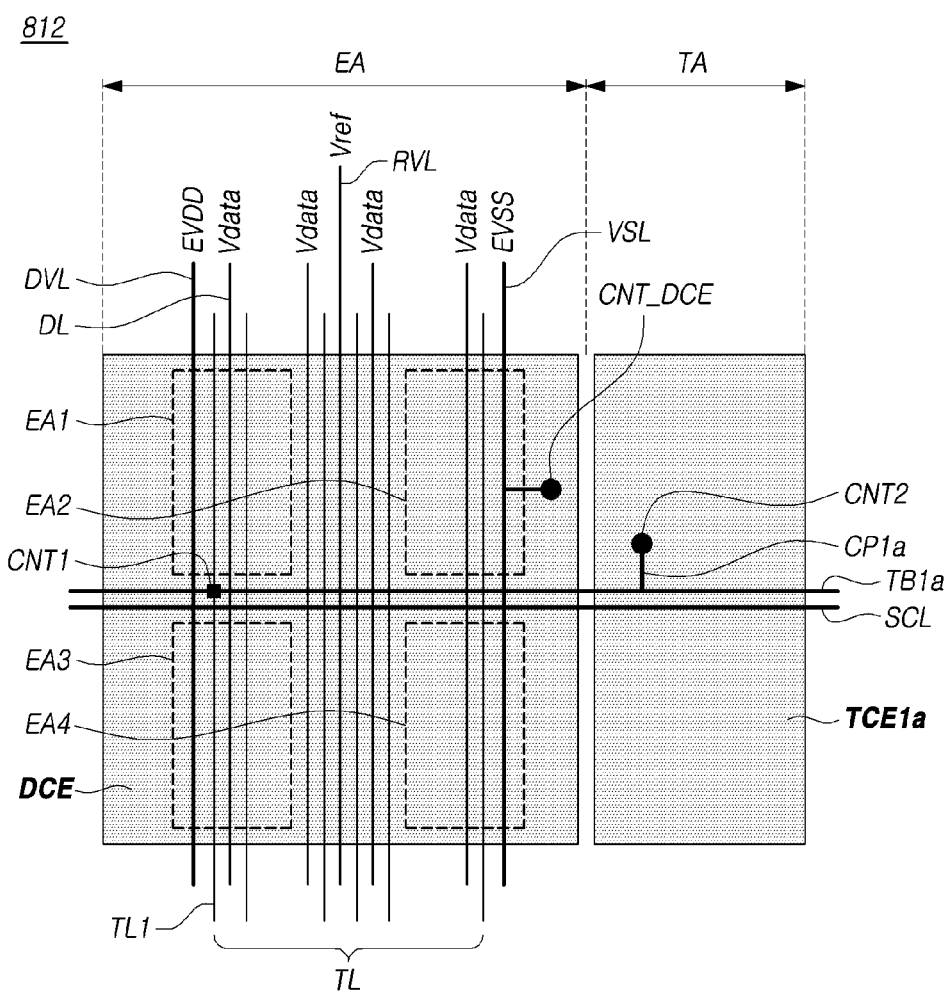
FIG. 12 is a view illustrating a second partial area in an area of a first touch electrode in a display panel when a touch display device is a transparent touch display device according to embodiments of the disclosure.
Figure 13A:
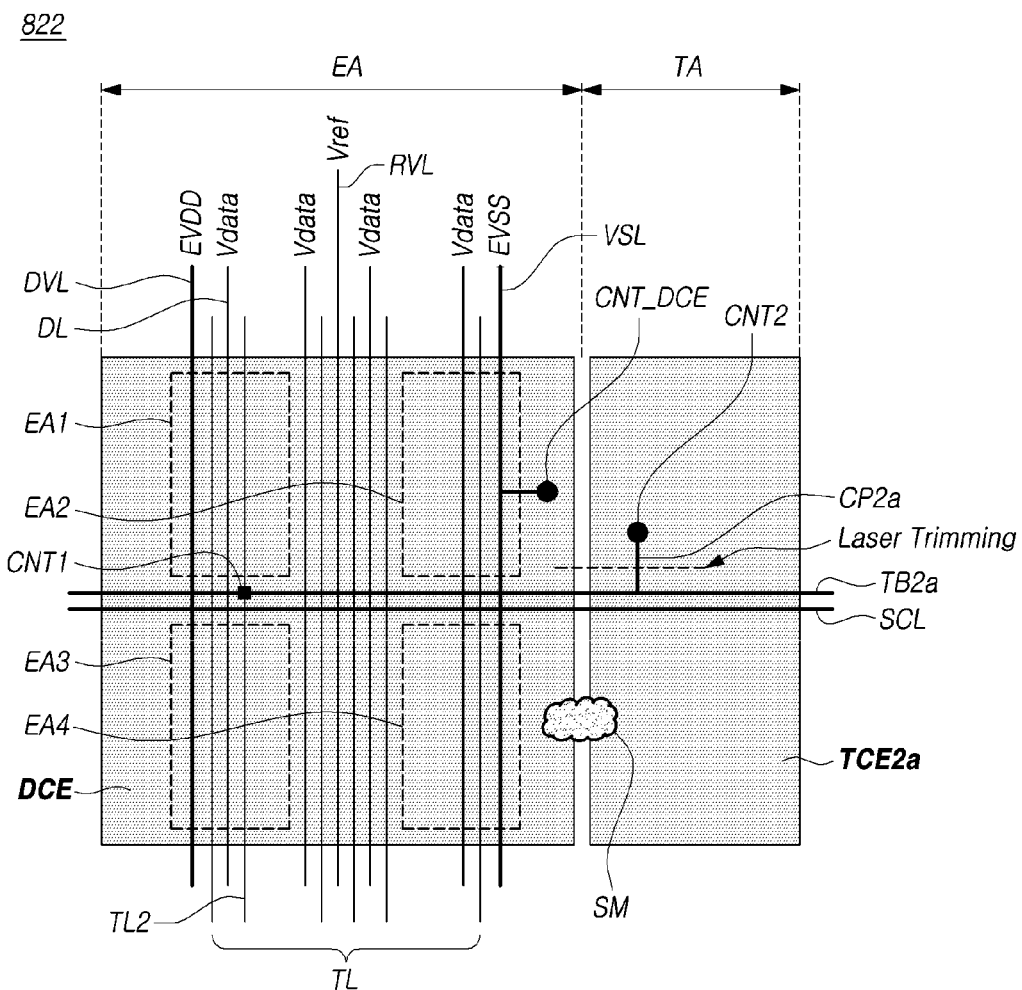
FIGS. 13A and 13B are views illustrating a second partial area in an area of a second touch electrode in a display panel when a touch display device is a transparent touch display device according to embodiments of the disclosure.
Figure 13B:
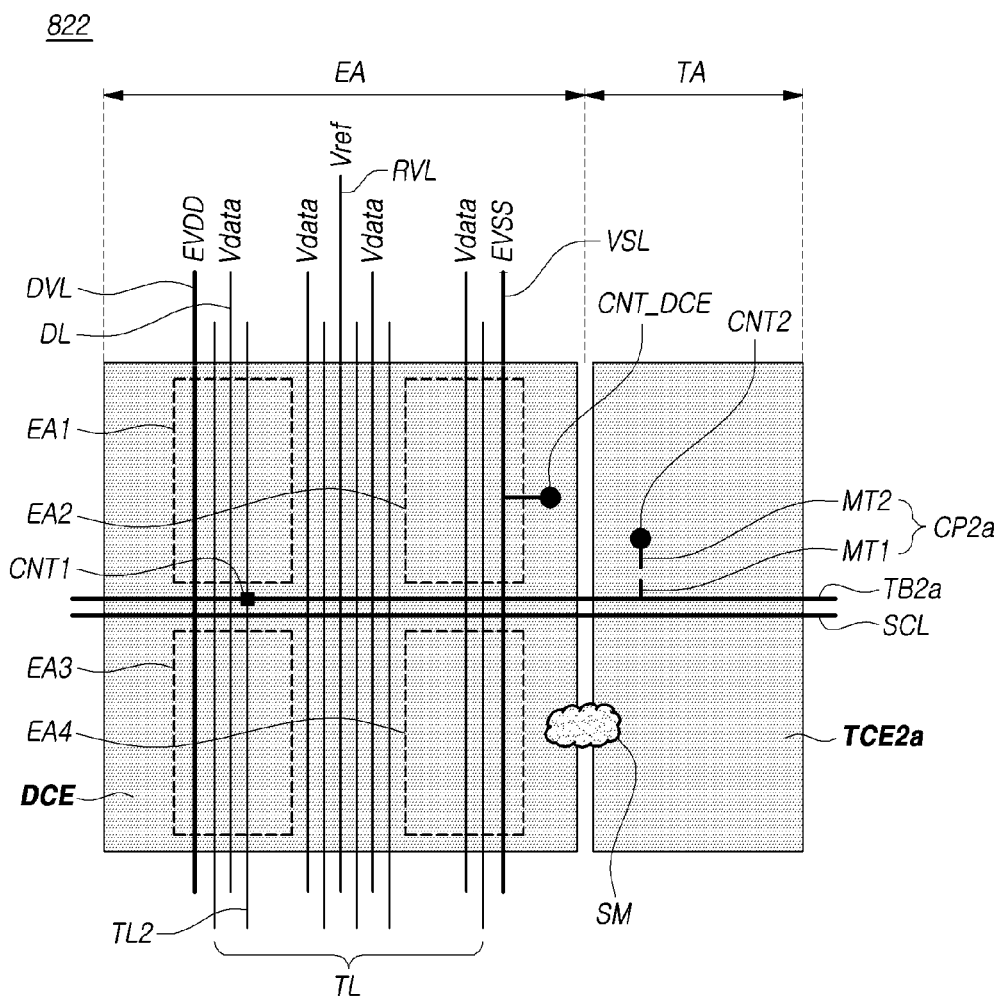

FIG. 11 illustrates light emitting areas EA and transmissive areas TA in a display panel 110 when a touch display device 100 is a transparent touch display device according to embodiments of the disclosure. FIG. 12 illustrates a second partial area 812 in an area of a first touch electrode TE1 in a display panel 110 when a touch display device 100 is a transparent touch display device according to embodiments of the disclosure. FIGS. 13A and 13B are views illustrating a second partial area 822 in an area of a second touch electrode TE2 in a display panel 110 when a touch display device 100 is a transparent touch display device according to embodiments of the disclosure.

Referring to FIG. 11, when the touch display device 100 according to embodiments of the disclosure is a transparent touch display device, the display panel 110 may include light emitting areas EA and transmissive areas TA. The transmissive areas TA may also be referred to as transparent areas.

Referring to FIG. 11, the light emitting areas EA may be areas through which light may not pass upward or downward of the display panel 110. In contrast, the transmissive areas TA may be areas through which light may pass upward or downward of the display panel 110. The transmissive areas TA may have a predetermined transmittance.

The light emitting areas EA may include light emitting areas of the subpixels SP and, in some cases, the light emitting areas EA may further include circuit areas of the subpixels SP. Various transistors DRT, SCT, and SENT and a storage capacitor Cst may be disposed in the circuit area.

The display cathode electrode DCE may be disposed to overlap the light emitting areas EA.

The touch cathode electrodes TCE including the first touch cathode electrode TCE1a and the second touch cathode electrode TCE2a may be disposed in the transmissive areas TA.

For example, the transmissive areas TA may be disposed on the left and right sides of the light emitting area columns of the light emitting areas EA. The light emitting areas EA and the transmissive areas TA may be disposed in other various arrangement structures, as well as the above-described arrangement structure.

FIG. 12 illustrates the second partial area 812 in the area of the first touch electrode TE1 of FIG. 8. FIGS. 13A and 13B illustrate the second partial area 822 in the area of the second touch electrode TE2.

Referring to FIG. 12, the first touch cathode electrode TCE1a may be disposed in the transmissive area TA, and the display cathode electrode DCE may be disposed in the light emitting area EA.

For example, the light emitting area EA may include the respective light emitting areas EA1, EA2, EA3, and EA4 of the first to fourth subpixels SP.

First to fourth data lines DL for supplying the data voltage Vdata to each of the first to fourth subpixels SP may be disposed in the light emitting area EA.

A driving voltage line DVL for supplying a driving voltage EVDD to each of the first to fourth subpixels SP may be disposed in the light emitting area EA.

A reference voltage line RVL for supplying a reference voltage Vref to each of the first to fourth subpixels SP may be disposed in the light emitting area EA.

A display cathode line VSL for transferring the display cathode voltage EVSS to the display cathode electrode DCE may be disposed in the light emitting area EA.

The display cathode line VSL may be connected to the display cathode electrode DCE through the cathode contact hole CNT_DCE.

The driving voltage EVDD, the reference voltage Vref, and the display cathode voltage EVSS are common display driving voltages. In other words, each of the driving voltage EVDD, the reference voltage Vref, and the base voltage EVSS may have a constant voltage value without variations in voltage level.

Accordingly, the driving voltage line DVL may be shared by the first to fourth subpixels SP. The reference voltage line RVL may be shared by the first to fourth subpixels SP. The display cathode line VSL may be shared by the first to fourth subpixels SP.

The data lines DL, the driving voltage line DVL, the reference voltage line RVL, and the display cathode line VSL may be disposed in parallel to each other and be disposed extending in a first direction (column direction).

The scan signal line SCL may be disposed extending in a second direction (row direction) crossing the data line DL. The scan signal line SCL may cross the light emitting area EA and the transmissive area TA.

Referring to FIG. 12, two or more touch lines TL may be disposed in the light emitting area EA. The two or more touch lines TL may include a first touch line TL1 to be connected to the first touch electrode TE1.

Referring to FIG. 12, the first touch bridge TB1a connected to the first touch line TL1 through the first contact hole CNT1 may be disposed parallel to the scan signal line SCL. In other words, the first touch bridge TB1a may cross the data lines DL, the driving voltage line DVL, the reference voltage line RVL, and the display cathode line VSL.

The first touch bridge TB1a may be connected to the first touch cathode electrode TCE1a disposed in the transmissive area TA in the second contact hole CNT2 through the first connection pattern CP1a.

The first touch line TL1 may overlap the light emitting area EA or may be disposed between the light emitting area EA and the transmissive area TA.

Referring to FIGS. 13A and 13B, the second touch cathode electrode TCE2a may be disposed in the transmissive area TA, and the display cathode electrode DCE may be disposed in the light emitting area EA.

For example, the light emitting area EA may include the respective light emitting areas EA1, EA2, EA3, and EA4 of the first to fourth subpixels SP.

First to fourth data lines DL for supplying the data voltage Vdata to each of the first to fourth subpixels SP may be disposed in the light emitting area EA.

A driving voltage line DVL for supplying a driving voltage EVDD to each of the first to fourth subpixels SP may be disposed in the light emitting area EA.

A reference voltage line RVL for supplying a reference voltage Vref to each of the first to fourth subpixels SP may be disposed in the light emitting area EA.

A display cathode line VSL for transferring the display cathode voltage EVSS to the display cathode electrode DCE may be disposed in the light emitting area EA.

The display cathode line VSL may be connected to the display cathode electrode DCE through the cathode contact hole CNT_DCE.

The data lines DL, the driving voltage line DVL, the reference voltage line RVL, and the display cathode line VSL may be disposed in parallel to each other and be disposed extending in a first direction (column direction).

The scan signal line SCL may be disposed extending in a second direction (row direction) crossing the data line DL. The scan signal line SCL may cross the light emitting area EA and the transmissive area TA.

Referring to FIGS. 13A and 13B, two or more touch lines TL may be disposed in the light emitting area EA. The two or more touch lines TL may include a second touch line TL2 to be connected to the second touch electrode TE2.

The second touch line TL2 may overlap the light emitting area EA or may be disposed between the light emitting area EA and the transmissive area TA.

Referring to FIGS. 13A and 13B, the second touch bridge TB2a connected to the second touch line TL2 through the first contact hole CNT1 may be disposed parallel to the scan signal line SCL. In other words, the second touch bridge TB2a may cross the data lines DL, the driving voltage line DVL, the reference voltage line RVL, and the display cathode line VSL.

Referring to FIG. 13A, the second touch cathode electrode TCE2a may be in a state of having been electrically shorted with the display cathode electrode DCE by a shorting material SM.

Accordingly, as shown in FIG. 13A, a laser trimming process for cutting off the second connection pattern CP2a may be performed during the panel manufacturing process.

Therefore, referring to FIG. 13B, in the manufactured display panel 110, in the second connection pattern CP2a, the first metal MT1 and the second metal MT2 spaced apart from each other may remain separated from each other.

Accordingly, the second touch line TL2 may be electrically separated from the second touch cathode electrode TCE2a disposed in the transmissive area TA.

As described above, as the second touch cathode electrode TCE2a is electrically separated from the second touch bridge TB2a and the second touch line TL2, the touch driving signal TDS output from the touch driving circuit 160 may be transferred to the second touch line TL2 and the second touch bridge TB2a but may not be transferred to the second touch cathode electrode TCE2a.

In other words, as the second touch cathode electrode TCE2a is electrically separated from the second touch bridge TB2a and the second touch line TL2, transfer of the touch driving signal TDS from the second touch bridge TB2a to the second touch cathode electrode TCE2a may be blocked.

Accordingly, even when the second touch cathode electrode TCE2a is shorted with the display cathode electrode DCE by the shorting material SM, it is possible to prevent the influence of touch driving on display driving.

The foregoing embodiments are briefly described below.

Embodiments of the disclosure may provide a touch display device comprising a display cathode electrode to which a display cathode voltage is applied, a first touch cathode electrode disposed in a same layer as the display cathode electrode and adjacent to the display cathode electrode, a first touch line connected with a touch driving circuit, a first touch bridge connected with the first touch line, a second touch cathode electrode disposed in a same layer as the display cathode electrode and adjacent to the display cathode electrode, a second touch line connected with the touch driving circuit, and a second touch bridge connected with the second touch line.

The first touch cathode electrode may be electrically separated from the display cathode electrode. In this case, the first touch bridge may be connected with the first touch cathode electrode. The first touch line and the first touch cathode electrode may be electrically connected with each other through the first touch bridge.

The second touch cathode electrode may be electrically shorted with the display cathode electrode. In this case, the second touch bridge may be electrically separated from the second touch cathode electrode, and the second touch line and the second touch cathode electrode may be electrically separated from each other.

The touch display device may further comprise a first connection pattern connecting the first touch bridge with the first touch cathode electrode.

The first connection pattern may be integrated with the first touch bridge or be an electrode different from the first touch bridge.

The first touch bridge may be disposed in a direction crossing the first touch line.

The first connection pattern may protrude from the first touch bridge.

The touch display device may further comprise a first metal connected with the second touch bridge and a second metal connected with the second touch cathode electrode.

The first metal and the second metal may be spaced apart from each other and be positioned in the same layer.

The first metal and the second metal may include the same material as the first connection pattern.

The touch display device may further comprise a plurality of touch electrodes electrically connectable to the touch driving circuit. The plurality of touch electrodes may include a first touch electrode and a second touch electrode. The number of a plurality of touch cathode electrodes constituting the first touch electrode and electrically connected with each other may differ from the number of a plurality of touch cathode electrodes constituting the second touch electrode and electrically connected with each other.

The touch display device may further comprise a third touch cathode electrode disposed in the same layer as the display cathode electrode and adjacent to the display cathode electrode.

The third touch cathode electrode may be electrically separated from the display cathode electrode.

The first touch bridge may be connected with the third touch cathode electrode.

The first touch line may be electrically connected with the first touch cathode electrode and the third touch cathode electrode through the first touch bridge.

The touch display device may further comprise a third connection pattern connecting the first touch bridge with the third touch cathode electrode.

The touch display device may further comprise a fourth touch cathode electrode disposed in the same layer as the display cathode electrode and adjacent to the display cathode electrode.

The fourth touch cathode electrode may be electrically separated from the display cathode electrode.

In this case, the second touch bridge may be connected with the fourth touch cathode electrode. The second touch line may be electrically connected with the fourth touch cathode electrode, of the second touch cathode electrode and the fourth touch cathode electrode, through the second touch bridge.

The touch display device may further comprise a fourth connection pattern connecting the second touch bridge with the fourth touch cathode electrode.

The touch display device may further comprise a fifth touch cathode electrode disposed in the same layer as the display cathode electrode and adjacent to the display cathode electrode and a third touch bridge connected with the first touch line.

The fifth touch cathode electrode may be electrically separated from the display cathode electrode.

In this case, the third touch bridge may be connected with the fifth touch cathode electrode. The first touch line and the fifth touch cathode electrode may be electrically connected with each other through the third touch bridge.

The touch display device may further comprise a fifth connection pattern connecting the third touch bridge with the fifth touch cathode electrode.

The touch display device may further comprise a sixth touch cathode electrode disposed in the same layer as the display cathode electrode and adjacent to the display cathode electrode and a fourth touch bridge connected with the second touch line.

The sixth touch cathode electrode may be electrically separated from the display cathode electrode.

In this case, the fourth touch bridge may be connected with the sixth touch cathode electrode. The second touch line and the sixth touch cathode electrode may be electrically connected with each other through the fourth touch bridge.

The touch display device may further comprise a sixth connection pattern connecting the fourth touch bridge with the sixth touch cathode electrode.

A shorting material may exist between the second touch cathode electrode and the display cathode electrode. In this case, the second touch cathode electrode and the display cathode electrode may be shorted by the shorting material. The shorting material may include at least one of a foreign material, an organic material, and a cathode electrode material.

The touch display device may further comprise an encapsulation layer disposed on the display cathode electrode, a plurality of light emitting layers disposed under the display cathode electrode, and a plurality of pixel electrodes disposed under the plurality of light emitting layers.

The first touch cathode electrode and the second touch cathode electrode may be disposed under the encapsulation layer.

The first touch line and the second touch line may be disposed under a cathode electrode layer where the display cathode electrode, the first touch cathode electrode, and the second touch cathode electrode are disposed.

The display cathode electrode may be disposed to overlap a light emitting area, and the first touch cathode electrode and the second touch cathode electrode may be disposed in a transmissive area.

The first touch line and the second touch line may overlap the light emitting area or may be disposed between the light emitting area and the transmissive area.

Embodiments of the disclosure may provide a touch display device comprising a display panel including a plurality of subpixels and a plurality of touch electrodes, a display driving circuit for driving the plurality of subpixels, and a touch driving circuit for driving the plurality of touch electrodes.

Each of the plurality of touch electrodes may include a plurality of touch cathode electrodes electrically connected with each other.

The plurality of touch electrodes may include a first touch electrode and a second touch electrode.

The number of a plurality of touch cathode electrodes constituting the first touch electrode and electrically connected with each other may differ from the number of a plurality of touch cathode electrodes constituting the second touch electrode and electrically connected with each other.

The display panel may further include a display cathode electrode positioned in the same layer as a plurality of touch cathode electrodes constituting each of the plurality of touch electrodes.

The number of a plurality of touch cathode electrodes constituting the second touch electrode and electrically connected with each other may be smaller than the number of a plurality of touch cathode electrodes constituting the first touch electrode and electrically connected with each other.

In this case, the display panel may further include a touch cathode electrode electrically shorted with the display cathode electrode.

The touch cathode electrode electrically shorted with the display cathode electrode may be disposed in an area of the second touch electrode and may not constitute the second touch electrode.

The touch cathode electrode electrically shorted with the display cathode electrode may be electrically separated from the plurality of touch cathode electrodes constituting the second touch electrode.

The display panel may further include a first touch line electrically connecting the plurality of touch cathode electrodes constituting the first touch electrode and electrically connected with each other with the touch driving circuit and a second touch line electrically connecting the plurality of touch cathode electrodes constituting the second touch electrode and electrically connected with each other with the touch driving circuit.

The display panel may further include one or more first touch bridges for electrically connecting the plurality of touch cathode electrodes constituting the first touch electrode and electrically connected with each other with the first touch line and one or more second touch bridges for electrically connecting the plurality of touch cathode electrodes constituting the second touch electrode and electrically connected with each other with the second touch line.

According to embodiments of the disclosure as described above, there may be provided a touch display device having touch sensor-dedicated touch electrodes embedded in the display panel without thickening the display panel and complicating the panel manufacturing process.

According to embodiments of the disclosure, there may be provided a touch display device that is free from degradation of image quality due to touch driving even when an undesired minute short circuit occurs between touch electrodes and a display driving-related electrode.

According to embodiments of the disclosure, there may be provided a touch display device in which a cathode electrode layer is composed of a display cathode electrode and touch cathode electrodes, and touch electrodes are configured through the touch cathode electrodes.

According to embodiments of the disclosure, there may be provided a touch display device that is free from degradation of image quality due to touch driving even when an undesired minute short circuit occurs between a display cathode electrode and a touch cathode electrode.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device, comprising:
a display cathode electrode to which a display cathode voltage is applied;
a first touch cathode electrode disposed in a same layer as the display cathode electrode and adjacent to the display cathode electrode;
a first touch line electrically connected with a touch driving circuit;
a first touch bridge electrically connected with the first touch line;
a second touch cathode electrode disposed in a same layer as the display cathode electrode and adjacent to the display cathode electrode;
a second touch line electrically connected with the touch driving circuit; and
a second touch bridge electrically connected with the second touch line,
wherein the first touch cathode electrode is electrically separated from the display cathode electrode, wherein the first touch bridge is electrically connected with the first touch cathode electrode, wherein the first touch line and the first touch cathode electrode are electrically connected with each other through the first touch bridge, and
wherein the second touch cathode electrode is electrically shorted with the display cathode electrode, wherein the second touch bridge is electrically separated from the second touch cathode electrode, and wherein the second touch line and the second touch cathode electrode are electrically separated from each other.

2. The touch display device of claim 1, further comprising a first connection pattern coupling the first touch bridge with the first touch cathode electrode.

3. The touch display device of claim 2, wherein the first connection pattern is integrated with the first touch bridge or is an electrode different from the first touch bridge,
wherein the first touch bridge is disposed in a direction crossing the first touch line, and
wherein the first connection pattern protrudes from the first touch bridge.

4. The touch display device of claim 2, further comprising a first metal coupled with the second touch bridge; and a second metal coupled with the second touch cathode electrode,
wherein the first metal and the second metal are positioned in a same layer, and
wherein the first metal and the second metal include a same material as the first connection pattern.

5. The touch display device of claim 1, further comprising a plurality of touch electrodes electrically connecting to the touch driving circuit, the plurality of touch electrodes including a first touch electrode and a second touch electrode,
wherein a number of a plurality of touch cathode electrodes constituting the first touch electrode and electrically connected with each other differs from a number of a plurality of touch cathode electrodes constituting the second touch electrode and electrically connected with each other.

6. The touch display device of claim 1, further comprising a third touch cathode electrode disposed in a same layer as the display cathode electrode and adjacent to the display cathode electrode,
wherein the third touch cathode electrode is electrically separated from the display cathode electrode,
wherein the first touch bridge is coupled with the third touch cathode electrode, and
wherein the first touch line is electrically connected with the first touch cathode electrode and the third touch cathode electrode through the first touch bridge.

7. The touch display device of claim 6, further comprising a third connection pattern connecting the first touch bridge with the third touch cathode electrode.

8. The touch display device of claim 1, further comprising a fourth touch cathode electrode disposed in a same layer as the display cathode electrode and adjacent to the display cathode electrode,
wherein the fourth touch cathode electrode is electrically separated from the display cathode electrode, wherein the second touch bridge is coupled with the fourth touch cathode electrode, and wherein the second touch line is electrically connected with the fourth touch cathode electrode, of the second touch cathode electrode and the fourth touch cathode electrode, through the second touch bridge.

9. The touch display device of claim 8, further comprising a fourth connection pattern coupling the second touch bridge with the fourth touch cathode electrode.

10. The touch display device of claim 1, further comprising:
- a fifth touch cathode electrode disposed in a same layer as the display cathode electrode and adjacent to the display cathode electrode;
- a sixth touch cathode electrode disposed in a same layer as the display cathode electrode and adjacent to the display cathode electrode;
- a third touch bridge coupled with the first touch line; and
- a fourth touch bridge coupled with the second touch line,
- wherein the fifth touch cathode electrode is electrically separated from the display cathode electrode,
- wherein the third touch bridge is coupled with the fifth touch cathode electrode,
- wherein the first touch line and the fifth touch cathode electrode are electrically connected with each other through the third touch bridge,
- wherein the sixth touch cathode electrode is electrically separated from the display cathode electrode,
- wherein the fourth touch bridge is coupled with the sixth touch cathode electrode,
- wherein the second touch line and the sixth touch cathode electrode are electrically connected with each other through the fourth touch bridge, and
- wherein the touch display device further includes:
  - a fifth connection pattern coupling the third touch bridge with the fifth touch cathode electrode; and
  - a sixth connection pattern coupling the fourth touch bridge with the sixth touch cathode electrode.

11. The touch display device of claim 1, wherein a shorting material exists between the second touch cathode electrode and the display cathode electrode, wherein the second touch cathode electrode and the display cathode electrode are shorted by the shorting material, and
wherein the shorting material includes at least one of a foreign material, an organic material, and a cathode electrode material.

12. The touch display device of claim 1, further comprising:
- an encapsulation layer disposed on the display cathode electrode;
- a plurality of light emitting layers disposed under the display cathode electrode; and
- a plurality of pixel electrodes disposed under the plurality of light emitting layers,
- wherein the first touch cathode electrode and the second touch cathode electrode are disposed under the encapsulation layer, wherein the first touch line and the second touch line are disposed under a cathode electrode layer where the display cathode electrode, the first touch cathode electrode, and the second touch cathode electrode are disposed.

13. The touch display device of claim 1, wherein the display cathode electrode is disposed to overlap a light emitting area,
wherein the first touch cathode electrode and the second touch cathode electrode are disposed in a transmissive area, and
wherein the first touch line and the second touch line overlap the light emitting area or are disposed between the light emitting area and the transmissive area.

14. The touch display device of claim 12, wherein the cathode electrode layer includes a plurality of the display cathode electrodes, and the touch display device further includes a display cathode line to electrically connect the plurality of the display cathode electrodes,
wherein the display cathode line is disposed in a layer different from the cathode electrode layer.

15. The touch display device of claim 4, wherein the first metal is integral with the second touch bridge and is a portion protruding from the second touch bridge.

16. The touch display device of claim 4, wherein the first metal and the second metal are spaced apart from each other.

17. The touch display device of claim 5, wherein the number of the plurality of touch cathode electrodes constituting the second touch electrode and electrically connected with each other is smaller than the number of the plurality of touch cathode electrodes constituting the first touch electrode and electrically connected with each other.

18. The touch display device of claim 13, wherein the transmissive areas is disposed on left and right sides of light emitting area columns of the light emitting area.

19. A touch display device, comprising:
- a display panel including a plurality of subpixels and a plurality of touch electrodes;
- a display driving circuit configured to drive the plurality of subpixels; and
- a touch driving circuit configured to drive the plurality of touch electrodes,
- wherein each of the plurality of touch electrodes includes a plurality of touch cathode electrodes electrically connected with each other,
- wherein the plurality of touch electrodes include a first touch electrode and a second touch electrode,
- wherein a number of a plurality of touch cathode electrodes constituting the second touch electrode and electrically connected with each other is smaller than a number of a plurality of touch cathode electrodes constituting the first touch electrode and electrically connected with each other,
- wherein the display panel further includes a display cathode electrode positioned in a same layer as a plurality of touch cathode electrodes constituting each of the plurality of touch electrodes,
- wherein the display panel further includes a touch cathode electrode electrically shorted with the display cathode electrode,
- wherein the touch cathode electrode electrically shorted with the display cathode electrode is disposed in an area of the second touch electrode and does not constitute the second touch electrode, and
- wherein the touch cathode electrode electrically shorted with the display cathode electrode is electrically separated from the plurality of touch cathode electrodes constituting the second touch electrode.

* * * * *